United States Patent
Kanehara

(10) Patent No.: US 12,265,337 B2
(45) Date of Patent: Apr. 1, 2025

(54) EXPOSURE APPARATUS

(71) Applicant: ASML NETHERLANDS B.V., Veldhoven (NL)

(72) Inventor: Junichi Kanehara, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/386,726

(22) Filed: Jul. 28, 2021

(65) Prior Publication Data

US 2021/0356876 A1    Nov. 18, 2021

Related U.S. Application Data

(63) Continuation of application No. 16/479,381, filed as application No. PCT/EP2018/052211 on Jan. 30, 2018, now Pat. No. 11,092,903.

(30) Foreign Application Priority Data

Feb. 3, 2017  (EP) ..................................... 17154551
May 2, 2017  (EP) ..................................... 17169025

(Continued)

(51) Int. Cl.
*G03F 9/00*   (2006.01)
*G03F 7/00*   (2006.01)

(52) U.S. Cl.
CPC ........ *G03F 9/7046* (2013.01); *G03F 7/70341* (2013.01); *G03F 7/70491* (2013.01); *G03F 7/706* (2013.01)

(58) Field of Classification Search
CPC .. G03F 7/70341; G03F 7/70491; G03F 7/705; G03F 7/706; G03F 9/7046; G03F 7/201
See application file for complete search history.

(56) References Cited

U.S. PATENT DOCUMENTS 5,448,332 A    9/1995   Sakakibara
5,606,172 A    2/1997   Morita et al.
(Continued)

FOREIGN PATENT DOCUMENTS

CN    101364049    2/2009
EP    1947683      7/2008
(Continued)

OTHER PUBLICATIONS

International Search Report and Written Opinion issued in corresponding PCT Patent Application No. PCT/EP2018/052211, dated Apr. 6, 2018. YR.

(Continued)

*Primary Examiner* — Deoram Persaud
(74) *Attorney, Agent, or Firm* — Pillsbury Winthrop Shaw Pittman, LLP

(57) ABSTRACT

An exposure apparatus arranged to project a radiation beam onto a target portion of a substrate, the exposure apparatus having: a first substrate holder configured to hold the substrate; a second substrate holder configured to hold the substrate; a sensor holder configured to hold a sensor and/or detector; a first measurement device having a first alignment system having an alignment sensor configured to measure positions of a substrate alignment mark on the substrate; a second measurement device having a second alignment system having a further alignment sensor configured to measure positions of the substrate alignment mark on the substrate; a first scale arranged on a lower surface of the first substrate holder; and a first encoder head arranged to cooperate with the first scale, the first encoder head located beneath the first alignment system and held by a stationary support.

20 Claims, 8 Drawing Sheets

(30) Foreign Application Priority Data

Sep. 29, 2017 (EP) .................................... 17193990
Nov. 10, 2017 (EP) .................................... 17201092

(56) References Cited

U.S. PATENT DOCUMENTS

| | | |
|---|---|---|
| 7,683,351 B2 | 3/2010 | Mos |
| 2002/0041377 A1 | 11/2002 | Hagiwara et al. |
| 2003/0211410 A1 | 11/2003 | Irie |
| 2005/0030507 A1* | 2/2005 | Teunissen ............. G03F 9/7019 355/53 |
| 2005/0052632 A1 | 3/2005 | Miyajima |
| 2005/0280788 A1* | 12/2005 | Kuit ..................... G03F 7/7075 355/72 |
| 2006/0058972 A1 | 3/2006 | Kok et al. |
| 2006/0092399 A1* | 5/2006 | Ockwell ............ G03F 7/70733 355/72 |
| 2007/0183064 A1 | 8/2007 | Shibazaki |
| 2008/0088843 A1 | 4/2008 | Shibazaki |
| 2008/0128642 A1 | 6/2008 | Mos et al. |
| 2008/0316460 A1 | 12/2008 | Loopstra et al. |
| 2009/0079951 A1* | 3/2009 | Modderman ......... G03F 7/7075 355/53 |
| 2009/0128791 A1 | 5/2009 | Koenen et al. |
| 2009/0233234 A1 | 9/2009 | Shibazaki |
| 2010/0045949 A1 | 2/2010 | Nakano et al. |
| 2010/0157274 A1 | 6/2010 | Shibazaki |
| 2011/0213584 A1* | 9/2011 | Menchtchikov .... G03F 7/70516 702/150 |
| 2012/0057171 A1 | 3/2012 | Khuat Duy |
| 2013/0107236 A1* | 5/2013 | Westerlaken ....... G03F 7/70875 355/30 |
| 2013/0250271 A1 | 9/2013 | Phillips et al. |
| 2016/0011525 A1 | 1/2016 | Phillips et al. |
| 2016/0203948 A1 | 7/2016 | Huynh et al. |
| 2016/0246185 A1* | 8/2016 | Ypma .................. G03F 7/70525 |

FOREIGN PATENT DOCUMENTS

| | | |
|---|---|---|
| EP | 3264180 | 1/2018 |
| JP | H07128869 | 5/1995 |
| JP | H10242048 | 9/1998 |
| JP | H11224854 | 8/1999 |
| JP | 2002014005 | 1/2002 |
| JP | 2002198303 | 7/2002 |
| JP | 2002353121 | 12/2002 |
| JP | 2003100612 | 4/2003 |
| JP | 2003100613 | 4/2003 |
| JP | 2004031921 | 1/2004 |
| JP | 2004260117 | 9/2004 |
| JP | 2005064373 | 3/2005 |
| JP | 2005064382 | 3/2005 |
| JP | 2005086030 | 3/2005 |
| JP | 2005086093 | 3/2005 |
| JP | 2005322721 | 11/2005 |
| JP | 2005322755 | 11/2005 |
| JP | 2006005140 | 1/2006 |
| JP | 2006114888 | 4/2006 |
| JP | 2006286747 | 10/2006 |
| JP | 2006294954 | 10/2006 |
| JP | 2007012673 | 1/2007 |
| JP | 2007091463 | 4/2007 |
| JP | 2007097379 | 4/2007 |
| JP | 2007189180 | 7/2007 |
| JP | 2008004581 | 1/2008 |
| JP | 2008147654 | 6/2008 |
| JP | 2009054737 | 3/2009 |
| JP | 2009124118 | 6/2009 |
| JP | 2009147342 | 7/2009 |
| JP | 2009147346 | 7/2009 |
| JP | 2009164399 | 7/2009 |
| JP | 2009170559 | 7/2009 |
| JP | 2009302400 | 12/2009 |
| JP | 2010212383 | 9/2010 |
| JP | 2011061128 | 3/2011 |
| JP | 2011101056 | 5/2011 |
| JP | 2011258842 | 12/2011 |
| JP | 2012060119 | 3/2012 |
| JP | 2012099850 | 5/2012 |
| JP | 2012124534 | 6/2012 |
| JP | 2013506270 | 2/2013 |
| JP | 2013161992 | 8/2013 |
| JP | 2013165134 | 8/2013 |
| JP | 2014120693 | 6/2014 |
| JP | 2014165291 | 9/2014 |
| JP | 2015032800 | 2/2015 |
| JP | 2015504236 | 2/2015 |
| JP | 2015515738 | 5/2015 |
| JP | 2015535615 | 12/2015 |
| JP | 2016128923 | 7/2016 |
| JP | 2016136268 | 7/2016 |
| JP | 2016184181 | 10/2016 |
| JP | 2016194599 | 11/2016 |
| JP | 2018124557 | 8/2018 |
| JP | 2018156100 | 10/2018 |
| JP | 2018190700 | 11/2018 |
| JP | 2019008323 | 1/2019 |
| JP | 2019015988 | 1/2019 |
| JP | 2019015989 | 1/2019 |
| JP | 2019015991 | 1/2019 |
| TW | 201637974 | 11/2016 |
| WO | 2005001543 | 1/2005 |
| WO | 2005064382 | 7/2005 |
| WO | 2005096354 | 10/2005 |
| WO | 2007055237 | 5/2007 |
| WO | 2007091463 | 8/2007 |
| WO | 2007097379 | 8/2007 |
| WO | 2007097466 | 8/2007 |
| WO | 2008029757 | 3/2008 |
| WO | 2008056735 | 5/2008 |
| WO | 2010018825 | 2/2010 |
| WO | 2011102109 | 8/2011 |
| WO | 2013100203 | 7/2013 |
| WO | 2014042044 | 3/2014 |
| WO | 2014073120 | 5/2014 |
| WO | 2015182788 | 12/2015 |
| WO | 2015193036 | 12/2015 |
| WO | 2016150631 | 9/2016 |

OTHER PUBLICATIONS

Yazaki, Yuma, et al.: "Settling Time Shortening Method Using Final State Control for High-precision Stage with Decouplable Structure of Fine and Coarse Parts", IECON 2014—40th Annual Conference of the IEEE Industrial Electronics Society, pp. 2859-2868 (2014).
Vvvmurthy, Sunil, et al.: "S-FIL™ Technology: Cost of Ownership Case Study", Proc. of SPIE, vol. 5751 (May 2005).
Wüest, Andrea, et al.: "Estimation of cost comparison of lithography technologies at the 22-nm half-pitch node", Proc. of SPIE, vol. 7271 (Mar. 2009).
Chinese Office Action issued in corresponding Chinese Patent Application No. 201880010064.6, dated May 11, 2021.
Japanese Office Action issued in corresponding Japanese Patent Application No. 2019-538369, dated Sep. 9, 2020.
Chinese Office Action issued in corresponding Chinese Patent Application No. 201880010064.6, dated Dec. 7, 2020.
Korean Office Action issued in corresponding Korean Patent Application No. 10-2021-7025777, dated Nov. 28, 2021.
European Search Report issued in corresponding European Patent Application No. 18702480, dated Jun. 2, 2022.
Taiwanese Office Action issued in corresponding Taiwanese Patent Application No. 109136704, dated Dec. 20, 2021.

* cited by examiner

EXPOSURE APPARATUS

This is a continuation of U.S. patent application Ser. No. 16/479,381, filed Jul. 19, 2019, which is the U.S. national phase entry of PCT patent application no. PCT/EP2018/052211, which was filed on Jan. 30, 2018, which claims priority of European patent application no. 17154551.0, which was filed on Feb. 3, 2017, claims priority of European patent application no. 17169025.8, which was filed on May 2, 2017, claims priority of European patent application no. 17193990.3, which was filed on Sep. 29, 2017, and claims priority of European patent application no. 17201092.8, which was filed on Nov. 10, 2017, each of the foregoing applications is incorporated herein in its entirety by reference.

FIELD

The present description relates to an exposure apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. A lithographic apparatus, which applies a desired pattern onto a substrate by irradiating a radiation beam, is also called an exposure apparatus. An exposure apparatus may be a stepper or a scanner. It is also possible to transfer a pattern from a patterning device to a substrate by imprinting the pattern onto the substrate. A lithographic apparatus, which applies a desired pattern onto a substrate by imprinting the pattern onto the substrate, may be called an imprint-type lithographic apparatus. An imprint-type lithographic apparatus that imprints an entire pattern onto a target portion of the substrate at one time may be called an imprint-type stepper.

There is a trend to reduce the production costs per IC. To reduce the production costs per IC, known lithographic apparatus have been designed to perform the exposure process, i.e., exposing a pattern on the substrate, as fast as possible and as often as possible. To have the exposure process as often as possible, a lithographic apparatus may have multiple substrate stages, as disclosed in U.S. Pat. No. 5,677,758. While a substrate on one substrate stage is being exposed, a second substrate is being loaded, unloaded, or aligned on a second substrate stage. When the one substrate has been fully exposed, the exposure process is only briefly interrupted to move the one substrate stage away from the projection system and move the other substrate stage below the projection system. This way, only during the brief interruption, the lithographic apparatus is not performing the exposure process.

SUMMARY

Despite the exposure process is interrupted only briefly, there is a desire to expose substrates to create IC's with a further reduced production cost per IC. In general, overall productivity of a lithographic apparatus is improved when throughput and/or uptime is improved. Good imaging quality of a pattern transferred onto a substrate is often required for manufacturing ICs. More accurate measurement of a substrate enables better imaging quality; however, if a more accurate measurement of a substrate is achieved by making a measurement time longer, the longer measurement time will deteriorate the overall productivity. In other words, there can be a trade-off between the overall productivity and the imaging quality in known lithographic apparatuses.

Such a trade-off is observed, e.g., during a wafer alignment operation conducted by the exposure apparatus described in the PCT-application publication No. WO 2007/097466A1. The exposure apparatus, described in this PCT publication, comprises a single wafer stage and a single wafer alignment system that comprises five alignment sensors lined up on a straight line along a first direction (e.g., along the x-axis or the stepping direction). When a wafer alignment operation is conducted as described in this PCT publication, the 16 alignment marks can be measured by the single (multi-sensor) wafer alignment system while moving the wafer stage only along a second direction, which is the direction perpendicular to the first direction (e.g., along the y-axis or the scanning direction). When a wafer alignment operation is conducted differently in this configuration, however, a longer measurement time can be necessary, e.g., in the following cases: 1) a larger number of alignment marks on a substrate needs to be measured for enabling a better imaging quality, and/or 2) at least one of the alignment marks on a substrate to be measured (e.g., one of the 16 alignment marks) is not located within the detection area of any one of the five alignment sensors (i.e., located outside of the detection area of the five alignment sensors); as a result, the wafer stage needs to be moved not only along the second direction but also along the first direction (i.e., not only along the y-axis but also along the x-axis).

In general, in an exposure apparatus that comprises a single wafer stage, the time spent (prior to exposure) on the wafer alignment operation is a pure overhead time and directly deteriorates the throughput performance of the exposure apparatus. Even in an exposure apparatus that comprises two wafer stages and a single wafer alignment system, in the case that the time spent on the wafer alignment operation is longer than the time spent on exposure, the throughput performance will be deteriorated. In general, an overall productivity of an exposure apparatus is proportional to the throughput performance for a certain uptime performance. Hence, a trade-off between the overall productivity and the imaging quality is observed in an exposure apparatus that comprises a single wafer stage and a single wafer alignment system. Also, there can be a trade-off between the overall productivity and the imaging quality in an exposure apparatus that comprises two wafer stages and a single wafer alignment system in the case that a large number of alignment marks on a substrate needs to be measured in order to qualify for a certain high imaging quality requirement.

Therefore, it is desirable, for example, to provide a lithographic apparatus in which better imaging quality can be achieved without deteriorating the overall productivity. In other words, it is desirable, for example, to provide a lithographic apparatus in which better overall productivity can be achieved while simultaneously qualifying for a sufficient imaging quality required for manufacturing ICs.

Additionally or alternatively, it is desirable, for example, to provide a lithographic apparatus that is flexibly and efficiently compatible with different substrate sizes since the desirable or available substrate size can be different depending on the types of ICs to be manufactured. Additionally or alternatively, it is desirable, for example, to provide a lithographic apparatus that is flexibly and efficiently compatible with different types of substrates that are made of different materials since the desirable or available types of substrates can be different depending on the types of ICs to be manufactured.

Additionally or alternatively, it is desirable, for example, to provide a lithographic apparatus that is more inexpensive (i.e., at a lower tool price) while simultaneously qualifying for a sufficient overall productivity and a sufficient imaging quality required for manufacturing a certain type of ICs. In other words, there can be a trade-off between an overall productivity of an exposure apparatus and the tool price of the exposure apparatus. Therefore, it is desirable, for example, to provide a lithographic apparatus that improves the CoO (Cost of Ownership) while simultaneously qualifying for a sufficient overall productivity and a sufficient imaging quality required for manufacturing a certain type of ICs. A contribution of a lithographic apparatus to the CoO may be estimated, e.g., as disclosed in Proc. of SPIE Vol. 5751, pp. 964-975 (2005) or Proc. of SPIE Vol. 7271 72710Y (2009). These publications may also be recognized as examples of the CoO calculations for different imaging quality requirements (e.g., for the 90 nm node and for the 22 nm node, respectively).

Additionally or alternatively, in practice, multiple exposure apparatuses and some other types of apparatuses are usually necessary for manufacturing ICs. Hence, it is desirable to improve a TCO (Total Cost of Ownership) of multiple exposure apparatuses and/or a TCO of all types of apparatuses and processes required for manufacturing ICs.

In other words, there can be a trilemma between an overall productivity, an imaging quality and economy (which may, e.g., be recognized in terms of a footprint, a tool price, a CoO and/or a TCO) of an exposure apparatus. In this context, in addition to various trade-offs described above, there can be a trade-off between an overall productivity of an exposure apparatus and the footprint (and/or the tool price) of the exposure apparatus. For example, an exposure apparatus, described in the PCT-application publication No. WO 2007/055237A1, comprises two illumination systems, two mask stages, two projection systems and two substrate stages. The tool price and footprint of such an exposure apparatus would be similar to two units of a conventional exposure apparatus, comprising a single illumination system, a single mask stage, a single projection system and a single substrate stage; furthermore, as the number of optical components (such as an illumination system and a projection system) is doubled, various problems of these optical components that can deteriorate the imaging quality would also be doubled. In other words, a trade-off between the overall productivity and the imaging quality would still be observed in such an exposure apparatus, which is equivalent or similar to concatenating multiple units of the conventional exposure apparatus. Therefore, such an exposure apparatus would not be economical and would not be a solution to the trilemma between the overall productivity, the imaging quality, and the economy of an exposure apparatus.

According to an aspect, there is provided an exposure apparatus comprising a substrate holder, a sensor holder and a mover. The substrate holder is for holding a substrate. The sensor holder is for holding a sensor. The mover is arranged for moving the substrate holder. The mover is arranged to couple with the sensor holder in a first situation so as to move the sensor holder. The mover is arranged to decouple from the sensor holder in a second situation so as to move without moving the sensor holder.

According to an aspect, there is provided an exposure apparatus comprising a substrate holder for holding a substrate, a sensor holder for holding a sensor, a mover arranged for moving the substrate holder, and a projection system arranged to provide a beam of radiation onto the substrate. During exposure, the projection system provides the beam of radiation onto the substrate when the sensor holder is decoupled from the mover. The mover couples with the sensor holder when the sensor measures a property of the projection system or the radiation beam.

According to an aspect, there is provided an exposure apparatus comprising a first substrate holder for holding a first substrate, a second substrate holder for holding a second substrate, a projection system for exposing the first substrate with an exposure beam, a measurement device arranged to provide measurement information of the second substrate, and a further measurement device arranged to provide measurement information of the first substrate. The further measurement device is closer to the projection system than the measurement device.

According to an aspect, there is provided an exposure apparatus comprising a first substrate holder configured to hold a substrate, a second substrate holder configured to hold the substrate, a sensor holder configured to hold a sensor, a projection system configured to expose the substrate with an exposure beam, a measurement device configured to provide measurement information of the substrate, and a further measurement device configured to provide further measurement information of the substrate. The sensor is configured to measure a property of the exposure beam and/or the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
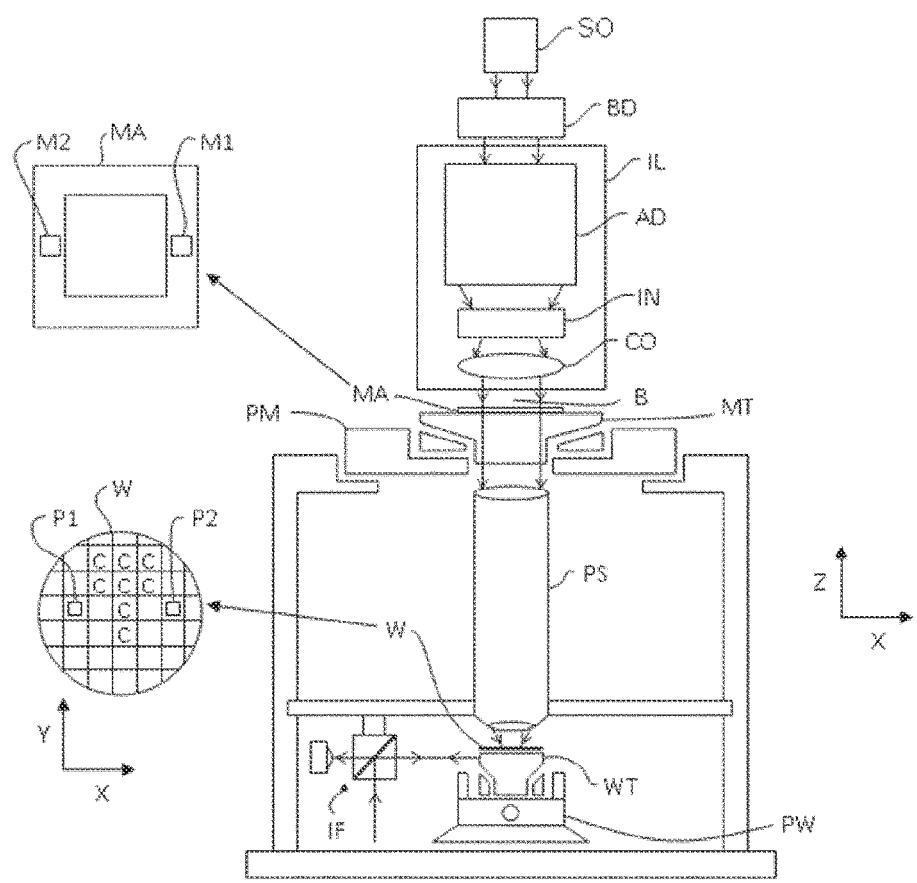
FIG. 1 depicts an embodiment of the invention.

FIG. 1 schematically depicts a lithographic apparatus according to one embodiment of the invention. The lithographic apparatus comprises an illumination system IL, a support structure MT, a substrate table WT and a projection system PS. The illumination system IL is configured to condition a radiation beam B. The support structure MT is constructed to support a patterning device MA and is connected to a first positioning device PM configured to accurately position the patterning device MA in accordance with certain parameters. The substrate table WT is constructed to hold a substrate W, e.g., a resist-coated wafer, and is connected to a second positioner PW configured to accurately position the substrate W in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The illumination system IL receives the radiation beam B from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm, or having a wavelength of or about 13.5 nm or 6.7 nm), as well as particle beams, such as ion beams or electron beams. The radiation beam may comprise visible light, such as the spectral lines provided by a Mercury lamp: a g-line (having a wavelength of or about 436 nm) and/or an h-line (having a wavelength of or about 405 nm). The visible light may be provided by a single LED (light-emitting diode) or a combination of multiple LEDs. A single LED or a combination of multiple LEDs may provide UV radiation, visible light and/or infrared radiation.

The support structure MT supports the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Additionally, the support structure MT may comprise a patterning device holder, a mechanism and/or a stage body that enable to actively bend the patterning device MA. By actively bending the patterning device MA, a curvature of the patterning device MA may be controlled. Such a support structure MT is disclosed in the US patent applications publication No. US 2013/0250271A1 and US 2016/0011525A1, hereby incorporated by reference.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. The patterning device MA may be referred to as a mask or a reticle. Optical properties of an aerial image (i.e., an aerial image of a pattern projected onto the substrate W) may be controlled by actively bending a transmissive mask, a transmissive reticle, or a reflective mask. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An additional table may be arranged to hold at least one sensor, instead of holding a substrate W. The at least one sensor may be a sensor to measure a property of the projection system PS, or a sensor to measure a property of the exposure radiation, a sensor to detect a position of a marker on the patterning device MA relative to the sensor or may be any other type of sensor. The additional table may comprise a cleaning device, for example for cleaning part of the projection system PS or any other part of the lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The radiation beam B is incident on the patterning device MA, which is held on the support structure MT, and is patterned by the patterning device MA. Having traversed the support structure MT, the radiation beam B passes through the projection system PS, which focuses the beam onto a target portion C of the substrate W. The radiation beam B, which is used for exposing the substrate W, may also be referred to as an exposure beam. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module provides movement of the support structure MT over a large range with limited accuracy (coarse positioning), whereas the short-stroke module provides movement of the support structure MT relative to the long-stroke module over a small range with high accuracy (fine positioning). Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Substrate alignment marks P1, P2 are known as scribe-lane alignment marks, when they are located in spaces between the target portions C. Similarly, in situations in which more than one die is provided on the patterning device MA, the mask alignment marks M1, M2 may be located between the dies.

The depicted apparatus could be used in at least one of the following modes:

In a first mode, the step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In a third mode, the support structure MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above. This mode of operation can also be readily applied to e-beam (electron beam) lithography.

The lithographic apparatus further includes a control unit which controls the actuators and sensors described. The control unit also includes signal processing and data processing capacity to implement desired calculations relevant to the operation of the lithographic apparatus. In practice, the control unit will be realized as a system of many sub-units. Each sub-unit may handle the real-time data acquisition, processing and/or control of component within the lithographic apparatus. For example, one sub-unit may be dedicated to servo control of the second positioner PW. Separate sub-units may handle the short-stroke module and the long-stroke module, or different axes. Another sub-unit may be dedicated to the readout of the position sensor IF. Overall control of the lithographic apparatus may be controlled by a central processing unit, communicating with the sub-units, with operators and with other apparatuses involved in the lithographic manufacturing process.

Combinations and/or variations on the above described modes of use or entirely different modes of use may also be employed.

The substrate W may be any one of the following substrates: a silicon (Si) wafer, a Silicon-Carbide (SiC) wafer, a Sapphire wafer, a Gallium Nitride (GaN) wafer, a GaN-on-Si wafer which is a silicon wafer with GaN layers, a Gallium Phosphide (GaP) wafer, a Gallium Antimonide (GaSb) wafer, a Germanium (GE) wafer, a Lithium Tantalate (LiTa) wafer, a Lithium Niobate (LiN) wafer, an Indium Arsenide (InAs) wafer, an Indium Phosphide (InP) wafer or a glass substrate. The substrate W may be made of any other materials such as Gallium Oxide and Gallium Arsenide. A substrate made of one of these materials may be more suitable than the others for the production of a specific type of ICs. The substrate W may have any suitable size for the production of IC's, for example, a diameter of 12.5 mm or 50 mm or 100 mm or 150 mm or 200 mm or 300 mm or 450 mm. The substrate W may have any suitable shape; e.g., the substrate W may be circular, square, or rectangular. The substrate W may have any suitable size for the production of a mask, a template, a reticle, a test reticle or a dummy reticle, e.g., 6 inches square (6 inches×6 inches). The substrate W may have any suitable size for the production of flat-panel-displays (FPD), for example, G4, G6 (e.g., a size of approximately 1.5 m×1.8 m), G8 (e.g., a size of approximately 2.2 m×2.5 m) or G10, etc. Multiple substrates may be contained in a FOUP (Front Opening Unified Pod); e.g., 25 silicon wafers may be contained in a FOUP. These wafers may be referred to as a lot of wafers. A substrate contained in a first FOUP may be referred to as a substrate in a first lot.

The lithographic apparatus of FIG. 1 is an example of an exposure apparatus. An exposure apparatus is an apparatus that provides an exposure device to expose a substrate W with an exposure beam, i.e., radiation beam B. By exposing the substrate W, a pattern is created on the substrate W. In case the exposure apparatus is an optical lithographic apparatus, the exposure device is usually referred to as a projection system PS. In an embodiment, the projection system PS comprises a lens barrel and multiple optical elements (such as lenses, prisms and/or mirrors). In an embodiment, the projection system PS further comprises a lens holder for holding each optical element and actuators (such as piezo-elements) for controlling the position (e.g., position in the vertical direction, i.e., along the z-axis) and orientation (e.g., tilting in the Rx- and Ry-directions). Examples of a projection system PS, which can be used in the context of an embodiment, are disclosed in the PCT patent application publications No. WO 2005/001543A1, WO 2005/064382A1 and WO 2007/091463A1, each hereby incorporated in its entirety by reference.

Another example of an exposure apparatus is an e-beam apparatus. Unlike an optical lithographic apparatus, the e-beam apparatus has an exposure device that provides an e-beam (electron beam) to the substrate W to create patterns on the substrate W. Such an exposure device may be referred to as a modulation device. An e-beam may comprise a beam of electrons. The e-beam apparatus may be arranged to provide multiple e-beams simultaneously, by having multiple exposure devices or by having a single exposure device arranged to provide multiple e-beams simultaneously. An example of a modulation device, which can be used in the context of an embodiment, is disclosed in Japanese patent application publication No. JP 2011-258842A, hereby incorporated in its entirety by reference.

Figure 2:
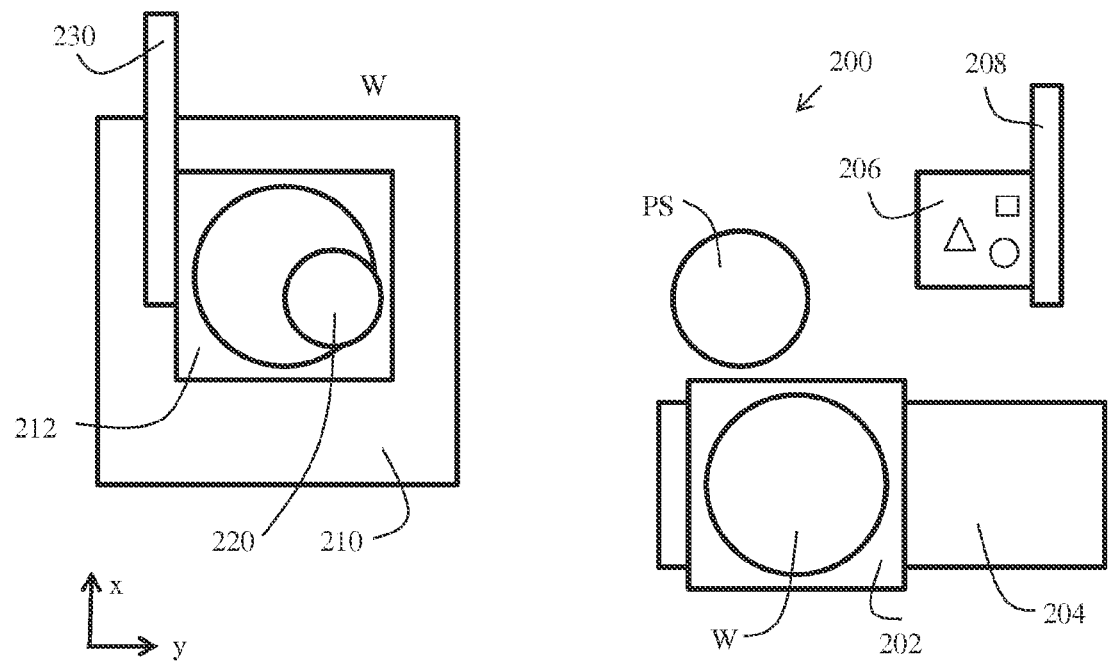
FIG. 2 depicts a further embodiment of the invention in a first view (e.g., in a top view)
Figure 3:
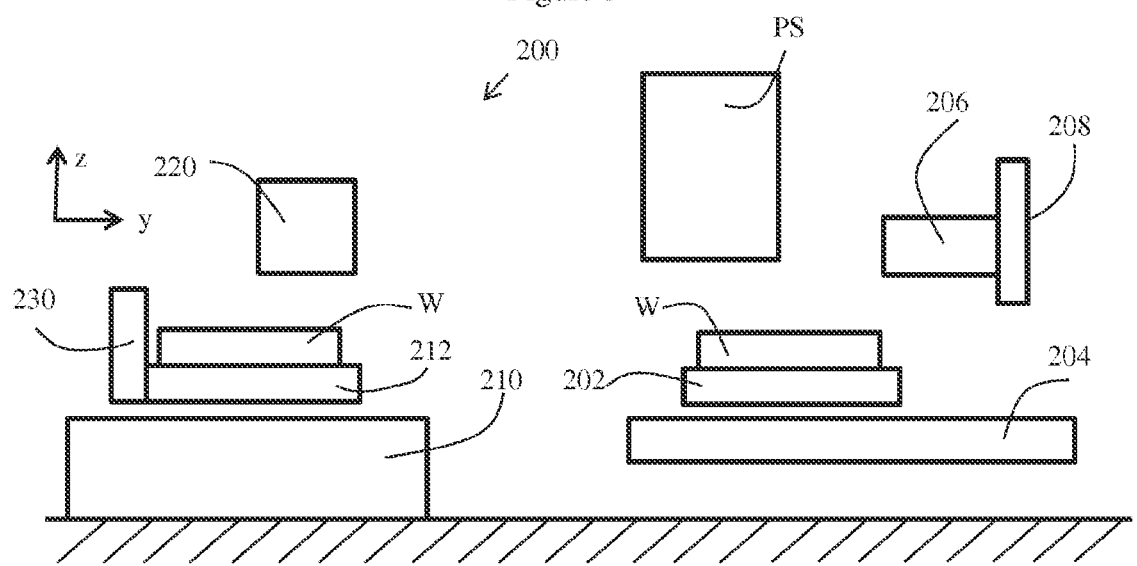
FIG. 3 depicts the embodiment of FIG. 2 in a second view (e.g., in a side view)

FIG. 2 depicts a first embodiment of the invention in a first view, e.g., in a top view. FIG. 3 depicts the first embodiment of the invention in a second view, e.g., in a side view. FIGS. 2 and 3 show part of an exposure apparatus 200 comprising a substrate holder 202, a sensor holder 206 and a mover 204. The substrate holder 202 is arranged to hold the substrate W. The sensor holder 206 is arranged to hold a sensor. The mover 204 is arranged to move the substrate holder 202. The substrate holder 202 may alternatively be referred to as 'substrate chuck' or 'wafer chuck'.

The mover 204 is arranged to move the substrate holder 202 relative to the projection system PS, so the exposure beam projected from the projection system PS can exposure all target portions C. The mover 204 may move in the x-direction, the y-direction and z-direction. The mover 204 and/or the substrate holder 202 may be provided with an actuator system for moving the substrate holder 202 relative to the mover 204 while the mover 204 supports the substrate holder 202. The mover 204 may be considered a long-stroke module for inaccurate movement over a large range. The substrate holder 202 may be considered a short-stroke module for accurate movement over a small range. The substrate holder 202 may support the substrate table WT or may be integrated with the substrate table WT. The mover 204 may be provided with a planar motor to move relative to the exposure device, e.g., projection system PS. The mover 204 may be arranged to move relative to the projection system PS in the scanning direction, e.g., the y-direction as indicated in FIG. 2. The mover 204 may be arranged to move relative to the projection system PS in a direction perpendicular to the scanning direction, e.g., the x-direction as indicated in FIG. 2. The direction perpendicular to the scanning direction may be referred to as the stepping direction. The mover 204 may move in the scanning direction while the substrate W is being exposed by the projection system PS. The mover 204 may move in the stepping direction while the substrate W is not being exposed by the projection system PS. The mover 204 may be arranged to move with a higher acceleration and/or velocity in one of the scanning direction and the stepping direction than in the other of the scanning direction and the stepping direction. The planar motor may have magnets on the mover 204 and coils on a base supporting the mover 204. Such a planar motor may be referred to as 'moving magnet type planar motor'. Alternatively, the planar motor has the coils on the mover 204 and the magnets on the base supporting the mover 204. Such a planar motor may be referred to as 'moving coil type planar motor'. Alternatively, the mover 204 may comprise one linear motor or multiple linear motors. Additionally or alternatively, the mover 204 may be arranged in an H-drive-arrangement; in other words, the mover 204 may comprise at least one X-linear motor (i.e., a linear motor configured to primarily move in the x-direction) and at least one Y-linear motor (i.e., a linear motor configured to primarily move in the y-direction). For example, the mover 204 arranged in an H-drive-arrangement may comprise a pair of Y-linear motors and an X-linear motor, whose stator is attached to the moving parts of the pair of Y-linear motors.

The sensor holder 206 holds at least one sensor. For example, the sensor holder 206 has one sensor, or the sensor holder 206 has multiple sensors. The sensor may be a sensor to measure a property of the exposure beam, such as dose or aberrations or uniformity. The sensor holder 206 may comprise the additional table to hold the sensor or may be integrated with the additional table. The sensor holder 206 may comprise a cleaning device, for example for cleaning part of the projection system PS or any other part of the lithographic apparatus. The sensor may comprise an aerial image measuring device configured to measure an aerial image of a pattern projected by the projection system PS.

In an embodiment the sensor holder 206 is provided with at least one of a sensor and a cleaning device. The sensor may be called a measurement member. In an embodiment the sensor holder 206 is provided with an illuminance irregularity sensor. The illuminance irregularity sensor is configured to detect irregularity of illuminance of the radiation beam B that is received at a pin-hole shaped light-receiving section of the illuminance irregularity sensor. In an embodiment the sensor holder 206 is provided with a sensor such as an aerial image measuring device. The aerial image measuring device is configured to measure an aerial image of a pattern projected by the projection system PS. In an embodiment the sensor holder 206 is provided with a sensor such as a wavefront aberration measuring device. A wavefront aberration measuring device is described in Japanese patent application Publication No. JP 2003-100613A, hereby incorporated by reference. The wavefront aberration measuring device is configured to measure aberration of a wavefront, for example using a Shack-Hartmann method. Such a wavefront aberration measuring device may also be referred to as an aberration sensor. In an embodiment the sensor holder 206 is provided with a sensor such as an illuminance monitor. The illuminance monitor is configured to receive the radiation beam B on an image plane of the projection system PS and to measure at least one property of the radiation beam B provided by the projection system PS. In an embodiment the wavefront aberration measuring device and/or the illuminance monitor are located on a top surface of the sensor holder 206.

In an embodiment, one of the sensors held by the sensor holder 206 is arranged to measure an aberration of the projection system PS, a pupil of the projection system PS, and/or a polarisation of the illumination system IL. Measurement data obtained by one of the sensors held by the sensor holder 206 may be used for conditioning or controlling a property of the projection system PS, the patterning device MA, the illumination system IL, and/or the radiation source SO in order to improve the imaging quality of an exposure apparatus. When the sensor is arranged to measure the aberration of the projection system PS, a simulation model can be used to predict a distortion of an image on the substrate W, i.e., an aerial image of a pattern projected onto the substrate W. Additionally or alternatively, the simulation model can be used to predict a change in the aberration of the projection system PS and/or can be used to predict a distribution of an illumination pupil of the illumination system IL. Additionally or alternatively, the simulation model can be used to predict a pattern created on the substrate W. Additionally or alternatively, a wavefront aberration measuring device and/or an aerial image measuring device may be used to calibrate, update and/or improve the simulation model. The use of a simulation model is not limited to when the sensor is arranged to measure the aberration of the projection system PS. In an alternative embodiment, a uniformity sensor is used (instead of the aberration sensor) to calibrate, update or improve the simulation model. The uniformity sensor may be supported by the sensor holder 206. Examples of a simulation model (or an algorithm used in a simulation model) that can be used in the context of an embodiment are disclosed in Japanese patent application publication nos. JP 2013-165134A and No. JP 2014-165291A and PCT patent application publication nos. WO 2011/102109A1, No. WO 2014/042044A1 and No. WO 2015/182788A1, each hereby incorporated in its entirety by reference. The examples of the sensors mentioned are schematically illustrated in the figures as a square, a circle and a triangle on the sensor holder 206. In an embodiment, the shape of the sensors may be different than illustrated.

In an embodiment, the aerial image measuring device, configured to measure an aerial image of a pattern projected by the projection system PS, comprises a detector, a fiducial plate and/or an optical element. The fiducial plate comprises a fiducial mark and/or a pair of aerial image measurement slit patterns. The aerial image measuring device may comprise multiple fiducial plates. In an embodiment, all parts of the aerial image measuring device are provided on the sensor holder 206. Alternatively, only part of the aerial image measuring device, e.g. only the detector, may be provided on the sensor holder 206. Alternatively or additionally, part of the aerial image measuring device, e.g. a fiducial plate, may be provided on the substrate holder 202. Alternatively, the aerial image measuring device may be provided on a dummy wafer as disclosed in the Japanese patent application publication No. JP 2007-189180A, hereby incorporated by reference. Such a dummy wafer may be loaded on the substrate holder 202 in place of the substrate W.

The exposure apparatus 200 may comprise an exchange mechanism 208 for providing the sensor holder 206 to the mover 204, for removing the sensor holder 206 from the mover 204, for supporting the sensor holder 206 and/or for moving the sensor holder 206.

Figure 4:
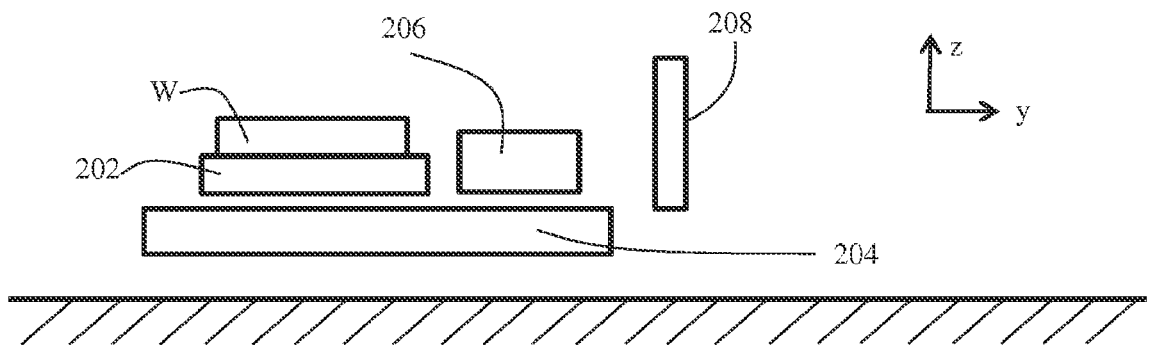
FIG. 4 depicts an exposure apparatus according to an embodiment of the invention in a first situation.

FIG. 4 depicts the exposure apparatus 200 in a first situation. The mover 204 is arranged to couple with the sensor holder 206 in the first situation so as to move the sensor holder 206. When the mover 204 and the sensor holder 206 are coupled to each other, a movement of the mover 204 may cause a movement of the sensor holder 206. The mover 204 may move the sensor holder 206 relatively to the projection system PS, so different parts of the sensor holder 206 may be beneath the projection system PS. For example, the mover 204 may move the sensor holder 206 relatively to the projection system PS so multiple sensors on the sensor holder 206 can be exposed with the exposure beam from the projection system PS (in other words, a property of the exposure beam can be measured by each of these sensors on the sensor holder 206).

As depicted in FIG. 4, both the substrate holder 202 and the sensor holder 206 are supported by the mover 204. The substrate holder 202 and the sensor holder 206 may be arranged to move in unison relatively to the mover 204 in the first situation. In case immersion techniques are applied in the exposure apparatus 200, during the move in unison (i.e., the movement of the substrate holder 202 and the sensor holder 206 in unison), immersion liquid may be transferred from one of the substrate holder 202 and the sensor holder 206 to the other of the substrate holder 202 and the sensor holder 206. During the move in unison, the substrate holder 202 and the sensor holder 206 may be in contact with each other or separated from each other by a gap. The gap may be small enough to limit or prevent leakage of immersion liquid between the substrate holder 202 and the sensor holder 206 during the move in unison. In case immersion techniques are practiced, the lithographic apparatus may comprise a liquid handling system configured to supply and confine the immersion liquid to a space defined between the projection system PS and at least one of the substrate holder 202, the substrate W, and the sensor holder 206.

Figure 5:
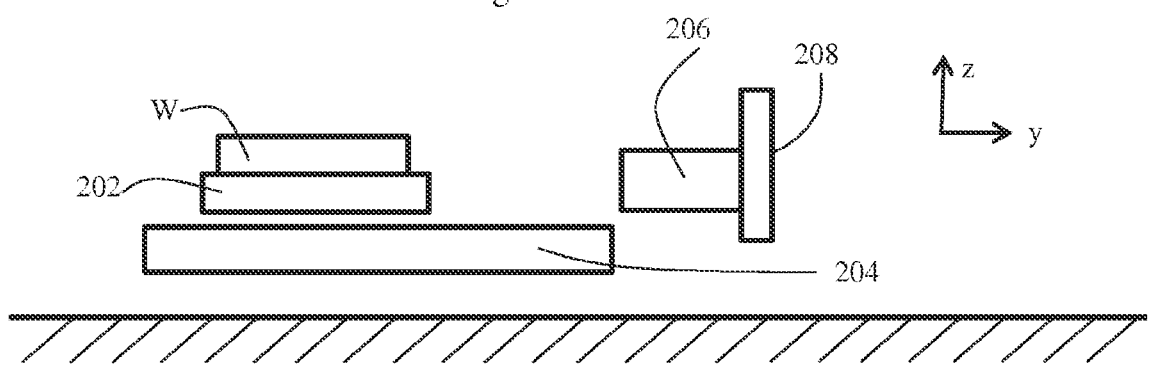
FIG. 5 depicts the exposure apparatus according to an embodiment of the invention in a second situation.

FIG. 5 depicts the exposure apparatus 200 in a second situation. The mover 204 is arranged to decouple from the sensor holder 206 in the second situation so as to move without the sensor holder 206. In the second situation, the mover 204 can move without the sensor holder 206. In the second situation, the mover 204 supports the substrate holder 202 and does not support the sensor holder 206. The sensor holder 206 is supported and/or moved by the exchange mechanism 208. When the sensor holder 206 is located near or at the projection system PS by the exchange mechanism 208, the sensor on the sensor holder 206 may perform a measurement. The exchange mechanism 208 may move the sensor holder 206 relatively to the projection system PS, so different parts of the sensor holder 206 may be located beneath the projection system PS. When the mover 204 moves in the second situation, the mover 204 does not move the mass of the sensor holder 206. In the second situation, the mover 204 may move the substrate holder 202 relative to the projection system PS so as to exposure the target portions C. The second situation may be during exposure. As the mover 204 does not need to move the mass of the sensor holder 206 in the second situation, the mover 204 may move faster. Alternatively, the mover 204 may make use of smaller actuators to achieve a desired acceleration. In case the mover 204 moves faster, more target portions C may be exposed per unit of time, reducing the costs per target portion C. In case the mover 204 makes use of smaller actuators, the lithographic apparatus may be less expensive (i.e., at a lower tool price). The lithographic apparatus may be less expensive, because less expensive actuators may be needed, a less expensive cooling system, less expensive amplifiers, etc.

Figure 6:
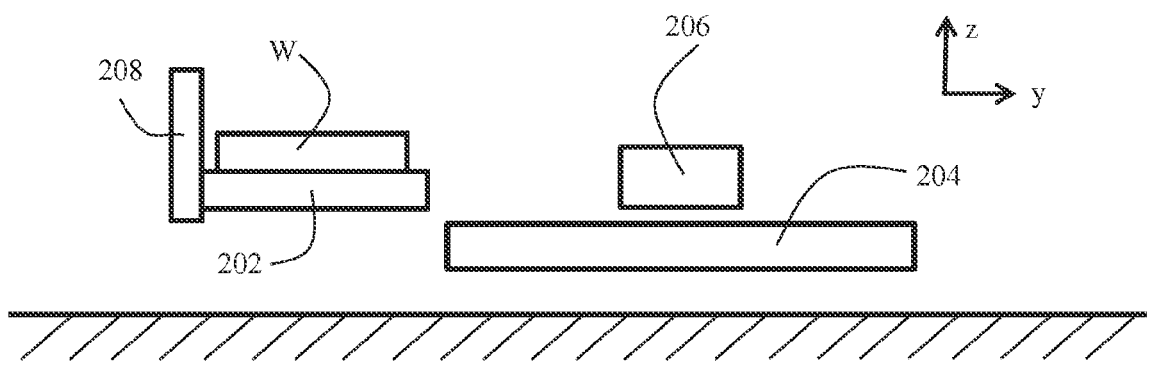
FIG. 6 depicts the exposure apparatus according to an embodiment of the invention in a third situation.

FIG. 6 depicts the exposure apparatus 200 in a third situation. The mover 204 supports the sensor holder 206. The exchange mechanism 208 supports the substrate holder 202. The exchange mechanism 208 may move the substrate holder 202 to a substrate unload location. When the substrate holder 202 is at the substrate unload location, a substrate handler may remove the substrate W from the substrate holder 202. In addition, a new substrate W may be placed on (or loaded onto) the substrate holder 202 at the substrate unload location. A new substrate W may be loaded onto the substrate holder 202 at another location, e.g., at a substrate load location. In the third situation, the sensor holder 206 may be located near or at the exposure device, e.g., the projection system PS. When the sensor holder 206 is located near or at the exposure device, the sensor on the sensor holder 206 may perform a measurement. The mover 204 may move the sensor holder 206 relatively to the projection system PS, so different parts of the sensor holder 206 may be located beneath the projection system PS.

The sensor holder 206 may be provided with an actuator to move relatively to the mover 204. For example, the actuator may be arranged to move the sensor holder 206 relatively to the mover 204 in the x-direction or the y-direction. The actuator system may comprise an array of coils and an array of magnets. One of the array of coils and the array of magnets may be provided on the sensor holder 206. The other of the array of coils and the array of magnets may be provided on the mover 204. The array of coils and the array of magnets may interact with each other to provide a driving force to move the sensor holder 206 relatively to the mover 204. Alternatively, the actuator may be provided with a single magnet or with a single coil. Additionally, a sensor system may be provided to determine a position of the sensor holder 206 relative to the mover 204. A controller may be provided that controls the actuator system based on a signal from the sensor system.

Figure 7:
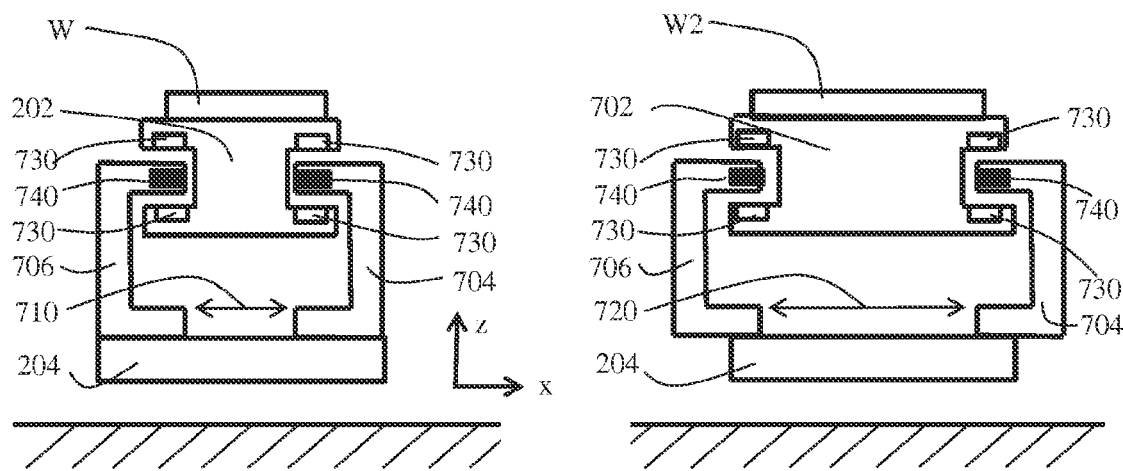
FIG. 7 depicts yet a further embodiment of the invention.

FIG. 7 depicts a further embodiment of the invention. The left part of FIG. 7 depicts a side view of the mover 204 supporting the substrate holder 202. The substrate holder 202 supports the substrate W of a certain diameter. The diameter may, e.g., be one of 12.5 mm or 50 mm or 100 mm or 150 mm or 200 mm or 300 mm or 450 mm. It may be beneficial if the exposure apparatus 200 is arranged to hold a further substrate W2 having a different diameter than substrate W, as shown in the right part of FIG. 7. The right part of FIG. 7 shows the mover 204 supporting a further substrate holder 702. The further substrate holder 702 is arranged to hold the further substrate W2. The diameter of the further substrate W2 is larger than the diameter of substrate W. The diameter of the further substrate W2 may, e.g., be one of 12.5 mm or 50 mm or 100 mm or 150 mm or 200 mm or 300 mm or 450 mm. The further substrate holder 702 is larger than the substrate holder 202. Alternatively, the further substrate holder 702 may be smaller than the substrate holder 202. To accommodate the further substrate holder 702, the mover 204 may have two parts; a left part 706 and a right part 704. Together, the left part 706 and the right part 704 are arranged to support the substrate holder 202 and the further substrate holder 702. When supporting the substrate holder 202, the left part 706 and the right part 704 are at a distance 710 from each other. When supporting the further substrate holder 702, the left part 706 and the right part 704 are at a distance 720 from each other. In case the further substrate holder 702 is larger than the substrate holder 202, the distance 720 is larger than the distance 710, so there is more space between the left part 706 and the right part 704 to support the further substrate holder 702 (i.e., in this case, the left part 706 and the right part 704 are more apart from each other). The left part 706 and the right part 704 may be manually adjustable to set the distances 710 and 720, or the mover 204 may be provided with an actuator to set (or adjust) the distances 710 and 720. The actuator may comprise a lead screw or a piezo actuator or any other suitable actuator to move the left part 706 and the right part 704 relative to each other. The mover 204 may comprise a sensor to provide a signal representative of the distances 710 and 720. The signal may be used as a control signal for the actuator to set (or adjust) the distances 710 and 720.

The embodiment of FIG. 7 may provide the benefit of having a single lithographic apparatus that is able to process substrates with different sizes. An IC-manufacturer does not have to buy a dedicated lithographic apparatus for each size of substrate; instead, a single lithographic apparatus processes substrates with different sizes, which results in an efficient use of the lithographic apparatus. The lithographic apparatus may be provide with a substrate holder handler. The lithographic apparatus may be provided with multiple substrate holder handlers. The substrate holder handler is arranged to couple with the substrate holder 202 and to remove the substrate holder 202 from the lithographic apparatus. The substrate holder handler is arranged to add the substrate holder 202 to the lithographic apparatus, for example, by putting the substrate holder 202 onto the mover 204. Similarly, the substrate holder handler may be arranged to add to and remove from the lithographic apparatus the other substrate holder 212 and/or the further substrate holder 702. For example, the exchange mechanism 208 may form the substrate holder handler. The exchange mechanism 208 may comprise multiple substrate holder handlers, and each of the substrate holder handler may be independently controlled. When the IC-manufacturer wants to expose a different size or type of substrate W, the substrate holder handler can remove the current substrate holder (i.e., the substrate holder currently in use) from the lithographic apparatus and replace it with another type of substrate holder that is suitable for the different size or type of substrate W. In this embodiment, the other substrate holder 212 may have the same size as the substrate holder 202, whereas the further substrate holder 702 may have a different size than the substrate holder 202. In this embodiment, there may be another substrate holder whose size is the same as the further substrate holder 702. In this embodiment, the substrate holder 202 and the other substrate holder 212 may be replaced with the further substrate holder 702 and another substrate holder whose size is the same as the further substrate holder 702 when the IC-manufacturer wants to expose a different size of substrate W. The substrate holder handler may be very similar to a wafer handler, and may, for example, comprise a robotic arm and/or a gripper to engage with the substrate holder.

The left part 706 and the right part 704 may each be provided with a coil array 740. The coil array 740 may extend in the y-direction. The substrate holder 202 and the further substrate holder 702 may be arranged with a magnet array 730. The magnet array 730 may extend in the y-direction. Alternatively, the left part 706 and the right part 704 each are provided with the magnet array 730, and the substrate holder 202 and the further substrate holder 702 are provided with the coil array 740. The magnet array 730 and the coil array 740 together form an actuator system to move the substrate holder 202 and the further substrate holder 702 relatively to the mover 204 in the y-direction. The actuator system may be arranged to move the substrate holder 202 and the further substrate holder 702 relatively to the mover 204 over a distance of one or several target portions C. This distance may be less than 100 mm or less than 50 mm or less than 20 mm or less than 10 mm or less than 5 mm or less than 2 mm. The actuator system may alternatively or in addition be arranged to move the substrate holder 202 relative to the mover 204 in the x-direction. A range of movement in the x-direction may be substantial smaller than a range of movement in the y-direction. For example, the actuator system may move the substrate holder 202 relative to the mover 204 in the x-direction over a range of less than 5 mm, e.g., less than 2 mm, e.g., less than 1 mm. The left part 706 and the right part 704 each may form a U-shape. The U-shape may form a space into which a position measurement system may extend. For example, an encoder system extends through the U-shape. The mover 204 may be arranged such that the substrate holder 202 may be coupled and decoupled to the mover 204 by moving along the direction of the magnet array 730, i.e., in the y-direction of FIG. 7. One of the magnet array 730 and the coil array 740 may form part of the actuator to move the sensor holder 206 relatively to the mover 204.

The mover 204 may support a guide system. The guide system may be arranged to guide a movement of the left part 706 and the right part 704 in the x-direction relatively to each other. For example, the guide system comprises a guide rail to allow a movement of the left part 706 along the x-direction relatively to the right part 704.

The guide rail that guides the left part 706 may be provided with two end stops. One end stop may be at one side of the guide rail. When the left part 706 is positioned at the one end stop, the left part 706 may be set to support the substrate holder 202. The other end stop may be at the other side of the guide rail. When the left part 706 is positioned at the other end stop, the left part 706 may be set (adjusted) to support the further substrate holder 702. Similarly, the guide rail that guides the right part 704 may be provided with two end stops. When the right part 704 is positioned at the one end stop, the right part 704 may be set to support the substrate holder 202. The other end stop may be at the other side of the guide rail. When the right part 704 is positioned at the other end stop, the right part 704 may be set to support the further substrate holder 702.

In an embodiment, the substrate holder 202 is arranged to hold the substrate W and the further substrate W2. For example, the substrate holder 202 may be provided with a clamping device to clamp the substrate W and the further substrate W2. The clamping device may provide a clamping force, e.g., a vacuum force or an electrostatic force, on a first area when clamping the substrate W. The clamping device may provide the clamping force on a second area when clamping the further substrate W2. The second area may be larger than the first area. The second area may have a larger diameter than the first area.

Figure 8:
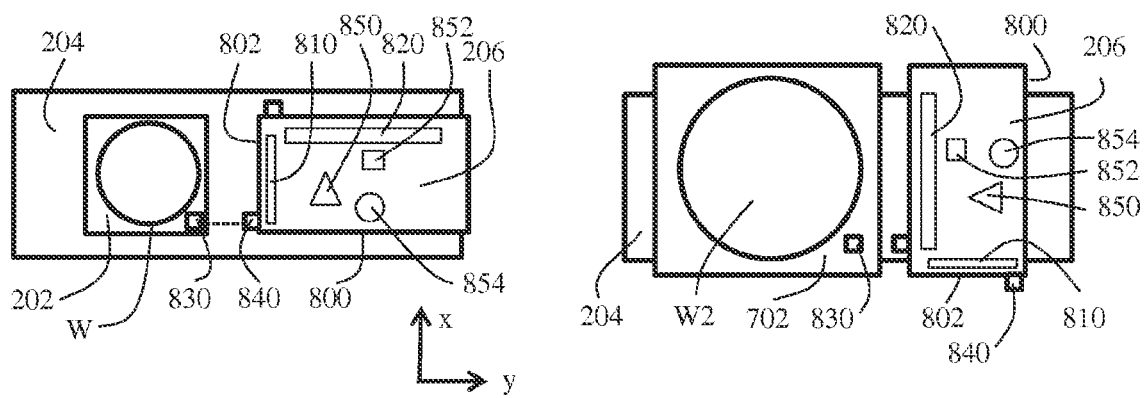
FIG. 8 depicts another embodiment of the invention.

FIG. 8 depicts an embodiment of the invention. In the left part of FIG. 8, the mover 204 supports the substrate holder 202 and the sensor holder 206. The sensor holder 206 has a width 800 and a length 802. The length 802 substantially equals a size of the substrate holder 202. For example, the size of the substrate holder 202 is about the diameter of the substrate W. The length 802 is about the diameter of the substrate W. The length 802 may substantially equal the size of the substrate holder 202 and may be long enough to accommodate a marker array 810. The marker array 810 may provide (or comprise) alignment markers along a distance about equal to the diameter of the substrate W; in other words, multiple alignment markers are arranged along the marker array 810. Further, the sensor holder 206 holds sensors 850, 852 and 854. At least one of sensors 850, 852 and 854 may comprise the illuminance irregularity sensor, the wavefront aberration measuring device or the uniformity sensor mentioned above. For example, the sensor 850 may comprise the illuminance irregularity sensor, the sensor 852 may comprise the wavefront aberration measuring device, and the sensor 854 may comprise the uniformity sensor. At least one of sensors 850, 852 and 854 may not be a sensor, but may be the cleaning device instead. At least one of sensors 850, 852 and 854 may be another type of sensor.

As shown in the right part of FIG. 8, the mover 204 supports the further substrate holder 702, which is larger than the substrate holder 202 to support the further substrate W2. Because the further substrate W2 is larger than the substrate W, the marker array 810 may not be large enough (or long enough) to provide sufficient alignment markers and/or to properly arrange alignment markers. In order to solve this issue, the sensor holder 206 is provided with a further marker array 820. The further marker array 820 is larger than the marker array 810. To support the further marker array 820, the width 800 substantially equals a size of the further substrate holder 702, meaning that the width 800 is longer than the length 802 in the situation where the further substrate holder 702 is larger than the substrate holder 202.

As shown in FIG. 8, the sensor holder 206 has a first orientation in the left part of FIG. 8, and a second orientation in the right part of FIG. 8. In the first orientation, the sensor holder 206 has a first angle along an axis perpendicular to a horizontal plane. In the first orientation, the width 800 is aligned along the y-axis and the length 802 is aligned along the x-axis. The first orientation may be defined as an angle along the z-axis of 0°. In the second orientation, the sensor holder 206 has a second angle along the axis perpendicular to the horizontal plane, wherein the first angle is different from the second angle. In the second orientation, the length 802 is aligned along the y-axis and the width 800 is aligned along the x-axis. The second orientation may be defined as an angle along the z-axis of 90°. In an embodiment, the difference between the angle in the first orientation and the angle in the second orientation may be a value other than 90°, for example 30°, or 45°, or 120° or 180°. The shape of the sensor holder 206 may be different from a rectangular shape, for example triangular or T-shaped.

In an embodiment, the sensor holder 206 has a length 802 and a width 800 that is suitably large for both the substrate holder 202 and the further substrate holder 702 in only the first orientation. Alternatively, two sensor holders 206 are provided, wherein one sensor holder is larger than the other sensor holder.

In an embodiment, the sensor holder 206 is arranged to receive a radiation beam (or an exposure beam) from the substrate holder 202. For example, the projection system PS propagates the exposure beam to the substrate holder 202. Via the substrate holder 202 at least part of the exposure beam is directed to the sensor holder 206. In an embodiment, the substrate holder 202 comprises a marker 830. The projection system PS exposes the marker 830 with the exposure beam to project an image on the marker 830. The exposure beam comprises information about the image projected on the marker 830. As the exposure beam propagates through the marker 830 and to the sensor holder 206, information about the image is propagated to the sensor holder 206. The sensor holder 206 may be provided with a detector 840 to receive the exposure beam and to provide (or generate) a signal representing the information about the image projected on the marker 830. For example, the information may be a position of the image on the marker 830, an interference pattern between the image and the marker 830, a distortion of the image as projected on the marker 830 or an intensity of the exposure beam. In addition to the detector 840, the sensor holder 206 may be provided with at least one additional detector. One of the at least one additional detector may be arranged on a side of the sensor holder 206 that is different from the side of the sensor holder 206 on which the detector 840 is arranged. For example, the detector 840 is arranged on the side of length 802 and the additional detector is arranged on the side of width 800. The additional detector may face the substrate holder 202 or the further substrate holder 702 when the sensor holder 206 is in the second orientation.

In an embodiment, the marker 830 and the detector 840 may be components of an aerial image measuring device configured to measure an aerial image of a pattern projected by the projection system PS. In this context, the marker 830 may comprise a fiducial plate or may comprise multiple fiducial plates. The detector 840 may provide information (or generate a signal representing information) about an aerial image (in other words, an aerial image measuring device measures an aerial image) when the substrate holder 202 and the sensor holder 206 are both supported by the mover 204. The detector 840 may provide information (or generate a signal representing information) about an aerial image when the substrate holder 202 and the sensor holder 206 perform the move in unison.

In an embodiment, the detector is not arranged on the sensor holder 206, but somewhere else, such that the sensor holder 206 is moveable relative to the detector. For example, the detector 840 may be arranged on the mover 204 or the detector 840 may be arranged on a stationary frame. In this embodiment, the sensor holder 206 may be provided with an optical component to direct the exposure beam to the detector 840.

Figure 9:
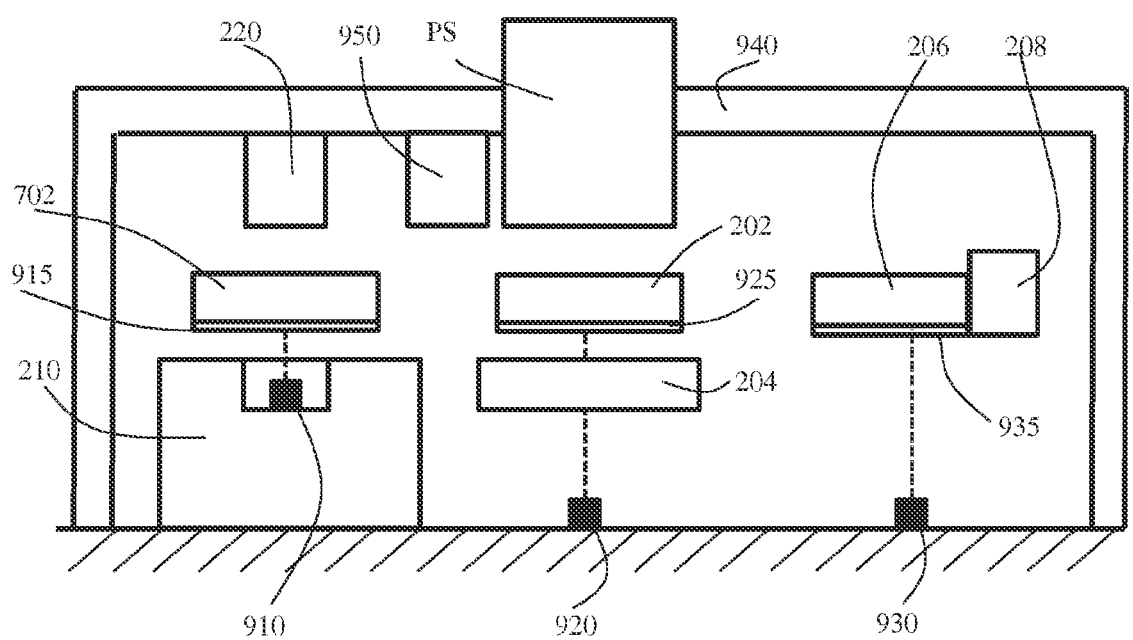
FIG. 9 depicts yet another embodiment of the invention in a side view.

As further depicted in FIG. 2 and FIG. 9, the exposure apparatus 200 may comprise an exposure device, e.g., projection system PS, and a measurement device 220. The exposure device is arranged to exposure the substrate W with the exposure beam. The measurement device 220 is arranged to provide measurement information of the substrate W (i.e., arranged to measure the substrate W). The exposure device and the measurement device 220 are distant to each other. The mover 204 is arranged to support the substrate holder 202 while near the exposure device.

The measurement device 220 may be any suitable device arranged to provide measurement information of the substrate W (i.e., arranged to measure the substrate W). For example, the measurement device 220 may provide of information about a height profile of the substrate W, e.g., about the flatness of the substrate W. Information about the height profile may be used to position the substrate W to a certain z-position during exposure of a certain target portion C, to create an in-focus image on the target portion C. Additionally or alternatively, the measurement device 220 may be arranged to provide information about in-plane deformation of the substrate W. For example, the measurement device 220 may provide information about the positions of substrate alignment marks P1, P2 on the substrate W. The information about the positions of substrate alignment marks P1, P2 may be used to determine the positions of the substrate alignment marks P1, P2 relative to each other or to compare the information with reference information. The information about in-plane deformation may be used to position the substrate W to a certain x- and y-position during exposure of a certain target portion C, to create an image at a correct x- and y-position on the substrate W.

The measurement device 220 may comprise multiple alignment sensors as disclosed in the US patent application US 2009-0233234A1, hereby incorporated by reference. In other words, the measurement device 220 may comprise an alignment system that comprises such multiple alignment sensors. Alternatively, the alignment system may comprise a single alignment sensor. The substrate W may be moved relative to the single alignment sensor during an alignment operation, so the substrate alignment marks P1, P2 face the single alignment sensor subsequently. During the alignment operation, the alignment sensor may generate position information, which is a type of measurement information, based on the positions of the substrate alignment marks P1, P2; in other words, the alignment sensor may measure the positions of the substrate alignment marks P1, P2. Additionally or alternatively, during the alignment operation, the alignment sensor may generate position information based on the positions of overlay marks, which may be located in a target portion C. Additionally or alternatively, during the alignment operation, the alignment sensor may generate position information based on the positions of both the substrate alignment marks P1, P2 and overlay marks; in other words, the alignment sensor may measure the positions of both the substrate alignment marks P1, P2 and overlay marks.

The exposure device and the measurement device 220 are distant to each other, so when the substrate W is at the exposure device, the substrate W is not at the measurement device 220 and vice versa. The substrate W may be moved from a location, where the measurement device 220 performs measurements to provide the measurement information, to another location, wherein the exposure device exposes the substrate W. In an embodiment, the exposure device and the measurement device 220 may be adjacent to each other. For example, when one edge of the substrate W is at the measurement device 220, another edge of the substrate W is at the exposure device.

In an embodiment, see FIG. 2, the mover 204 is arranged to support the substrate holder 202 while the substrate holder 202 is near the exposure device. A stationary support 210 is provided to support another substrate holder 212 while the other substrate holder 212 is near the measurement device 220. The other substrate holder 212 may be the same or similar to one of the substrate holder 202 and the further substrate holder 702. The stationary support 210 may be provided with an actuator system to move the other substrate holder 212 relative to the stationary support 210. The actuator system may be part of a movement device 230 arranged to move the other substrate holder 212 while supported by the stationary support 210. For example, the movement device 230 comprises a robot arm arranged to move the other substrate holder 212 in the x- and y-direction. The movement device 230 may comprise multiple robotic arms. The robot arm may be arranged to rotate the other substrate holder 212 along the z-axis. In other words, during operation of the measurement device 220 (e.g., during the alignment operation), the movement device 230 may move the other substrate holder 212 with respect to the stationary support 210 in the horizontal directions. In an embodiment, the other substrate holder 212 is provided with one of the magnet array 730 and the coil array 740. The actuator system may be partly formed by the one of the magnet array 730 and the coil array 740. Another part of the actuator system may be arranged on a top surface of the stationary support 210. For example, the top surface is provided with an array of magnets or an array of coils. The array of magnets or the array of coils may be arranged in a 2D-array extending in both the x-direction and the y-direction. In brief, during operation of the measurement device 220, the other substrate holder 212 may be moved with respect to the stationary support 210 (e.g., in the horizontal directions) by the actuator system (or part of the actuator system) provided on the other substrate holder 212 itself.

In an embodiment, the exchange mechanism 208 may be arranged to transfer the other substrate holder 212 from the stationary support 210 to the mover 204. Additionally or alternatively, the exchange mechanism 208 may be arranged to transfer the substrate holder 202 from the mover 204 to the stationary support 210. The exchange mechanism 208 may move the other substrate holder 212 while the other substrate holder 212 is supported by the stationary support 210 during operation of the measurement device 220. The movement device 230 and the exchange mechanism 208 may be arranged and operated similarly. The movement device 230 and the exchange mechanism 208 may be simultaneously operated at different locations in the exposure apparatus 200. For example, as depicted in FIGS. 2 and 3, the movement device 230 may hold (and/or move) the other substrate holder 212 while the exchange mechanism 208 may hold (and/or move) the sensor holder 206.

The top surface of the stationary support 210 may be provided with gas outlets to provide a gas film between the top surface and the other substrate holder 212. The gas film may function as a gas bearing, supporting the other substrate holder 212 without physical contact between the other substrate holder 212 and the top surface. Each of the gas outlets may be provided with a valve. The valve may be arranged to open when the other substrate holder 212 is near or above the gas outlet and may be arranged to close when the other substrate holder 212 is away from the gas outlet. The gas provided by the gas outlet may comprise air, nitrogen or any other suitable gas.

In an embodiment as shown in FIG. 9, the exposure apparatus 200 may be provided with a first encoder head 910 and a first scale 915. The stationary support 210 comprises a recess for holding the first encoder head 910. The first scale 915 is arranged at a bottom surface of the other substrate holder 212. The first encoder head 910 faces the first scale 915 while the other substrate holder 212 is near or at the measurement device 220 and is arranged to provide (or generate) a first signal representative of positional information of the other substrate holder 212. For example, the first encoder head 910 may provide (or generate) a signal representing the position of the other substrate holder 212 along the x-axis, and/or along the y-axis and/or along the z-axis and/or a rotation about the x-axis, and/or a rotation about the y-axis, and/or a rotation about the z-axis. The first encoder head 910 may be an encoder head system comprising multiple encoder heads and/or comprising other position sensors than encoder heads, for example capacitive or interferometric sensors. Such an encoder head system may also be referred to as a position measurement device or a position measurement system.

The first encoder head 910 may be coupled to the stationary support 210 via a dynamical isolator. The dynamical isolator may comprise a mechanical spring or a damper. The mechanical spring may be a helical spring or a leaf spring. The damper may comprise a viscous damper or a viscoelastic damper. The dynamical isolator may comprise an actuator, a sensor and a controller. The sensor may be arranged to detect a vibration of the stationary support 210. Based on input from the sensor, the controller may control the actuator to actuate so as to prevent the vibration of the stationary support 210 to vibrate the first encoder head 910. For example, the actuator is a piezo-actuator or a reluctance actuator or a Lorentz actuator. Alternatively, the sensor, controller and actuator may be arranged to have the first encoder head 910 maintain a desired position relative to a reference, independently of vibrations of the stationary support 210. The reference may be the measurement device 220 or the exposure device.

As shown in FIG. 9, the exposure device, e.g., projection system PS, is supported by a frame 940. In an embodiment, the exposure device is movable relative to the frame 940. When the exposure device is able to move relative to the frame 940, the exposure device is able to change the path of the exposure beam. For example, when the exposure device is able to move in the x-direction, the exposure device is able to shift the path of the exposure beam in the x-direction. By shifting the path of the exposure beam, a larger portion of the substrate W can be exposed by the exposure beam without movement of the substrate holder 202. Alternatively or in addition, by shifting the path of the exposure beam in the direction of movement of the substrate holder 202, a certain part of the substrate W can be exposed for a longer period of time. The exposure device may be moveable relative to the frame 940 along the x-axis, the y-axis or both. The exposure device may be moved by an actuator such as a piezo actuator or a Lorentz actuator. The exposure device may be guided by a guiding device. The guiding device may comprise flexible elements such as leaf springs. The guiding device may comprise a gas bearing. Alternatively or in addition, the projection system PS may be supported by the frame 940 via an AVIS (Active Vibration Isolation System). Such an AVIS may comprise a damper, a spring, a position sensor, and/or an actuator (such as a voice coil motor). In an embodiment, the exposure device is movable with respect to the frame 940 in the vertical direction, i.e., along the z-axis. The AVIS enables to attenuate vibrations that can be propagated between the frame 940 and the projection system PS. An example of an AVIS, which can be used in the context of an embodiment, is disclosed in Japanese patent application publication no. JP 2016-194599A, hereby incorporated in its entirety by reference. As vibrations are a typical type of undesired disturbance that deteriorates the imaging quality of a lithographic apparatus, an AVIS can improve the imaging quality of a lithographic apparatus without deteriorating the overall productivity.

In an embodiment, the exposure apparatus 200 is provided with a further measurement device 950 arranged to provide further measurement information of the substrate W (i.e., arranged to perform a further measurement of the substrate W). The further measurement device 950 is closer to the exposure device (e.g., the projection system PS) than the measurement device 220. The measurement device 220 is further away from the exposure device (e.g., the projection system PS) than the further measurement device 950. The further measurement device 950 may be similar to the measurement device 220 and may provide similar information about the substrate W. For example, the further measurement device 950 may be the same type of a sensor system as the measurement device 220, but the measurement device 220 may provide with information about the substrate W at a better accuracy than the further measurement device 950 by taking a longer measurement time; in other words, the further measurement device 950 may take less measurement time to complete a measurement of the substrate W. The further measurement device 950 may perform a measurement of the substrate W while the substrate holder 202 is supported by the mover 204.

Information provided by the further measurement device 950 may be used to determine the z-position of the surface of the substrate W relative to an image plane of the exposure device. The further measurement device 950 may comprise a levelling sensor system that provides information about a height profile of the substrate W, e.g, a flatness of the substrate W. A levelling sensor system may also be referred to as an auto-focus system. The control unit may make use of both the information about the height profile of the substrate W as well as information provided by the aerial image measuring system to determine a positional relationship between the substrate W and the patterning device MA. The control unit may process multiple signals obtained by the levelling sensor system and the aerial image measuring system to determine the positional relationship between the substrate W and the patterning device MA. The control unit may process multiple signals and/or execute an algorithm as disclosed in the PCT-application publication No. WO 2005/096354A1, hereby incorporated by reference.

The levelling sensor system may comprise a light source to provide a beam of radiation. The beam of radiation (e.g., light) may be directed to the top surface of the substrate W. The beam of radiation is reflected by the top surface back to the levelling sensor system. Based on the reflection (i.e., based on the reflected light), the levelling sensor system may generate a signal representative of the height profile. The light source may provide the beam of radiation with a plurality of wavelengths and/or with a continuous spectrum. The radiation beam may comprise infrared light, visible light and/or UV-light. The light source may comprise an LED (light-emitting diode) or may comprise multiple LED's. The light source may have LED's with different colours such as orange, red, green, cyan, blue and violet (e.g., having a peak wavelength of or about 630, 605, 560, 505, 470 or 405 nm, respectively). The leveling sensor system may provide the beam of radiation at a slanted angle with the substrate W. The leveling sensor system may provide the beam of radiation such that the beam of radiation is incident on a large part of the substrate W, for example, along a line across the substrate W.

Information of the further measurement device 950 may be used to determine the x- and y-positions the substrate W relative to an image of a reference mark of the patterning device MA, for example the mask alignment marks M1, M2. Additionally or alternatively, the further measurement device 950 may provide information about the positions of substrate alignment marks P1, P2 on the substrate W; in other words, the further measurement device 950 may measure the positions of substrate alignment marks P1, P2 on the substrate W. The information about the positions of substrate alignment marks P1, P2 may be used to determine the positions of the substrate alignment marks P1, P2 relative to each other or to compare the information with reference information. The further measurement device 950 may comprise a wafer alignment sensor system that provides information about in-plane deformation of the substrate W. The further measurement device 950 may comprise multiple alignment sensors as disclosed in the US patent application US 2009-0233234A1, hereby incorporated by reference. In other words, the wafer alignment sensor system may comprise such multiple alignment sensors. Alternatively, the wafer alignment sensor system may comprise a single alignment sensor. The information about in-plane deformation may be used to position the substrate W to a certain x- and y-position during exposure of a certain target portion C, to create an image at a correct x- and y-position on the substrate W. The control unit may make use of both the information about the in-plane deformation of the substrate W and information provided by the aerial image measuring system to determine a positional relationship between the substrate W and the patterning device MA. The control unit may process multiple signals obtained by the wafer alignment sensor system and the aerial image measuring system to determine the positional relationship between the substrate W and the patterning device MA. The control unit may process multiple signals and/or execute an algorithm as disclosed in the PCT-application publication No. WO 2007/097379A1, hereby incorporated by reference.

In an embodiment, the exposure apparatus 200 comprises a second encoder head 920 and a second scale 925. The second scale 925 is arranged at a bottom surface of the substrate holder 202. The second encoder head 920 is arranged to face the second scale 925 so as to provide (or generate) a second signal representative of positional information of the substrate holder 202. The second encoder head 920 faces the second scale 925 while the substrate holder 202 is near or at the exposure device, e.g., the projection system PS, and is arranged to provide (or generate) a second signal representative of positional information of the substrate holder 202. For example, the second encoder head 920 may provide (or generate) the second signal representing the position of the substrate holder 202 along the x-axis, and/or along the y-axis and/or along the z-axis and/or a rotation about the x-axis, and/or a rotation about the y-axis, and/or a rotation about the z-axis. The second encoder head 920 may be an encoder head system comprising multiple encoder heads and/or comprising other position sensors than encoder heads, for example capacitive or interferometric sensors. Such an encoder head system may also be referred to as a position measurement device or a position measurement system. The second encoder head 920 may be mounted on a measurement arm. The measurement arm may be attached to the frame 940 and may extend below the substrate holder 202. The second encoder head 920 may be located along the optical axis of the exposure device.

The substrate holder 202 and the other substrate holder 702 may exchange position such that the first encoder head 910 faces the second scale 925 and such that the second encoder head 920 faces the first scale 915. In that situation, the first encoder head 910 may provide (or generate) the first signal that is representative of positional information of the substrate holder 202. In that situation, the second encoder head 920 may provide (or generate) the second signal that is representative of positional information of the other substrate holder 702.

In an embodiment, the exposure apparatus 200 comprises a third encoder head 930 and a third scale 935. The third scale 935 is arranged at a bottom surface of the sensor holder 206. The third encoder head 930 is arranged to face the third scale 935 so as to provide (or generate) a third signal representative of positional information of the sensor holder 206. The third encoder head 930 faces the third scale 935 while the sensor holder 206 is supported by the exchange mechanism 208, and is arranged to provide the third signal representative of positional information of the sensor holder 206. For example, the third encoder head 930 may provide the third signal representing the position of the sensor holder 206 along the x-axis, and/or along the y-axis and/or along the z-axis and/or a rotation about the x-axis, and/or a rotation about the y-axis, and/or a rotation about the z-axis. The third encoder head 930 may be an encoder head system comprising multiple encoder heads and/or comprising other position sensors than encoder heads, for example capacitive or interferometric sensors. Such an encoder head system may also be referred to as a position measurement device or a position measurement system. The third encoder head 930 may be mounted on a further measurement arm. The further measurement arm may be attached to the frame 940 and may extend below the sensor holder 206.

In an embodiment, the further substrate holder 702 may have the same size as the substrate holder 202 or may have a different size. For example, in the embodiment of FIGS. 3 and 9, in a lithographic apparatus that is compatible only with a single size of substrates, the other substrate holder 212 and/or the further substrate holder 702 may be identical to the substrate holder 202. Alternatively or additionally, in a lithographic apparatus that is compatible only with a single size of substrates made of different materials, the further substrate holder 702 may have the same size as the substrate holder 202, but the further substrate holder 702 may be made of a different material from the substrate holder 202. Alternatively, in the embodiment of FIGS. 7 and 8, in a lithographic apparatus that is compatible with multiple sizes of substrates, the further substrate holder 702 may have a different size than the substrate holder 202, and the further substrate holder 702 may be replaceable with the other substrate holder 212, whose size is the same as the substrate holder 202. Additionally or alternatively, the further substrate holder 702 may hold a different type of substrate W than a substrate on the substrate holder 202; e.g., a dummy wafer may be loaded on the substrate holder 202 when the substrate W is loaded on the further substrate holder 702 at a certain moment during operation of a lithographic apparatus. In an embodiment, the exposure apparatus 200 comprises two substrate holders 202 and two further substrate holders 702. The two substrate holders 202 may have the same size. The two further substrate holders 702 may have the same size or may be larger than the two substrate holders 202. In a first operation mode, the exposure apparatus uses the two substrate holders 202 to hold substrates W, while storing the two further substrate holders 702, for example at a storing location in the exposure apparatus 200. The two further substrate holders 702 may remain idle (i.e., remain unused) during the first operation mode. In a second operation mode, the exposure apparatus uses the two further substrate holders 702 to hold substrates W, while storing the two substrate holders 202, for example at the storing location in the exposure apparatus 200. The two substrate holders 202 may remain idle (i.e., remain unused) during the second operation mode.

The sensor holder 206 may take the position of the substrate holder 202 such that the second encoder head 920 faces the third scale 935. In that situation, the second encoder head 920 may provide (or generate) the second signal that is representative of positional information of the sensor holder 206.

In an embodiment, there is provided an exposure apparatus comprising the substrate holder 202, the sensor holder 206, the mover 204 and the projection system PS. The substrate holder 202 is for holding the substrate W. The sensor holder 206 is for holding a sensor. The mover 204 is arranged for moving the substrate holder 202. The projection system PS is arranged to provide a beam of radiation onto the substrate W. During exposure, the projection system PS provides the beam of radiation onto the substrate W when the sensor holder 206 is decoupled from the mover 204. The mover 204 may couple with the sensor holder 206 when the sensor measures a property of the projection system PS or the radiation beam.

The exposure apparatus may comprise the exchange mechanism 208 for providing the sensor holder 206 to the mover 204 and for removing the sensor holder 206 from the mover 204.

The mover 204 may be arranged to move a further substrate holder 702 for holding a further substrate W2. The size of the further substrate W2 may be different from the size of the substrate W. By configuring the exposure apparatus in such a way, the exposure apparatus can flexibly and efficiently be compatible with different sizes of substrates. A single exposure apparatus that is able to expose substrates with different sizes can improve the CoO (Cost of Ownership) and/or the TCO (Total Cost of Ownership), comparing to the case that each of multiple exposure apparatuses is dedicated to exposing a specific size of substrates.

The sensor holder 206 has a length and a width. The length may substantially equal a size of the substrate holder 202. The width substantially may equal a size of the further substrate holder 702. The length and the width may be different from each other.

The mover 204 may be arranged to support the sensor holder 206 in a first orientation and in a second orientation. In the first orientation, the sensor holder 206 has a first angle along an axis perpendicular to a horizontal plane. In the second orientation, the sensor holder 206 has a second angle along the axis perpendicular to the horizontal plane. The first angle is different from the second angle.

The mover may be arranged to decouple from the substrate holder so as to move without moving the substrate holder.

The sensor holder 206 may be arranged to receive the radiation beam from the substrate holder 202. The substrate holder 202 may comprise a marker (e.g., the marker 830). The radiation beam may comprise information about an image projected on the marker. The sensor holder 206 may be arranged to propagate the radiation beam to a detector (e.g., the detector 840). The sensor holder 206 may be movable relative to the detector.

The exposure apparatus may comprise an exposure device and a measurement device. The exposure device is arranged to expose the substrate with an exposure beam. The measurement device is arranged to provide measurement information of the substrate W. The exposure device and the measurement device are distant to each other. The mover 204 is arranged to support the substrate holder 202 while near the exposure device.

The exposure apparatus may comprise the stationary support 210 arranged to support the substrate holder 202 while near the measurement device.

The exposure apparatus may comprise a first encoder head 910 and a first scale 915. The stationary support 210 may comprise a recess for holding the first encoder head 910. The first scale is arranged at a bottom surface of the substrate holder 202. The first encoder head 910 faces the first scale 915 while the substrate holder 202 is near the measurement device 220 and is arranged to provide a signal representative of positional information of the substrate holder 202. The first encoder head 910 may be coupled to the stationary support 210 via a dynamical isolator. The exposure apparatus may comprise a movement device arranged to move the substrate holder while supported by the stationary support. The exposure apparatus may comprise the frame 940 for supporting the exposure device. The exposure device may be movable relative to the frame. The exposure apparatus may comprise a further measurement device 950 arranged to provide further measurement information of the substrate W. The further measurement device 950 may be closer to the exposure device than the measurement device.

The exposure apparatus may comprise a second encoder head 920. The second encoder head 920 is arranged to face the first scale 915 so as to provide a second signal representative of positional information of the substrate holder 202.

The exposure apparatus may comprise a third encoder head 930 and a third scale 935. The third scale 935 is arranged at a bottom side of the sensor holder 206. The third encoder head 930 is arranged to face the third scale 935, so as to provide a third signal representative of positional information of the sensor holder 206.

The embodiment of the lithographic apparatus of FIG. 9 may be operated in the following way. The following way is illustrated in FIGS. 10A-10I in a schematic top-view.

Figure 10A:
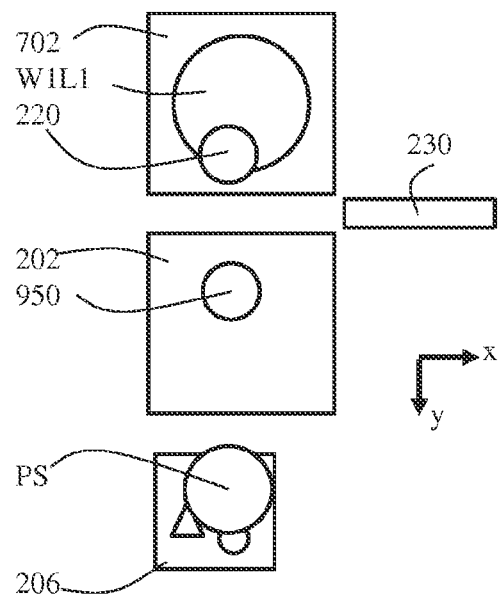
FIGS. 10A-10I depict a way of operating the embodiment of FIG. 9 in top views.

A first substrate in a first lot W1L1 is loaded on the further substrate holder 702; see FIG. 10A. The first substrate in the first lot W1L1 is also referred to as the first substrate W1L1 in this embodiment. The further substrate holder 702 moves the first substrate W1L1 to the measurement device 220. The measurement device 220 provides measurement information of the first substrate W1L1. The measurement information is wafer alignment information, which is information relating to the shape and the position of the first substrate W1L1. The measurement device 220 provides fine wafer alignment information, which is based on a large number of measurements, e.g. based on measuring the positions of a large number of the substrate alignment marks relative to one another or to compare the information with reference information. In this embodiment, all substrate alignment marks on a wafer, e.g., 96 substrate alignment marks on a wafer may be measured by the measurement device 220. Substrate alignment marks on a wafer may also be referred to as wafer alignment marks. Additionally, the measurement device 220 may also measure overlay marks on the first substrate W1L1. The fine wafer alignment information provides accurate information about a large part of the surface (or the entire surface) of the first substrate W1L1. At this moment, the sensor holder 206 may be located beneath the projection system PS, and the sensor on the sensor holder 206 may measure the property of the projection system PS, the property of the aerial image, and/or the property of the exposure beam.

Figure 10B:
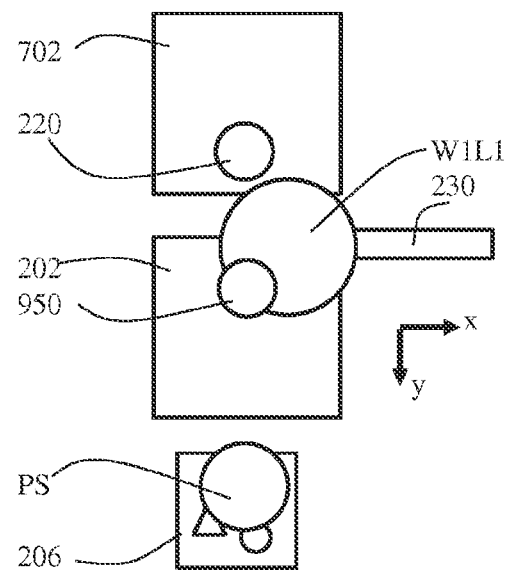

As depicted in FIG. 10B, after the measurement device 220 has collected the measurement information, the movement device 230 transports the first substrate W1L1 from the further substrate holder 702 to the substrate holder 202. The movement device 230 is arranged to pick up the first substrate W1L1 from the further substrate holder 702 and to place the first substrate W1L1 onto the substrate holder 202. In other words, the movement device 230 is configured to unload the first substrate W1L1 from the further substrate holder 702 and then to load the first substrate W1L1 on the substrate holder 202. At this moment, the movement device 230 may load a second substrate in the first lot W2L1 on the further substrate holder 702. The second substrate in the first lot W2L1 is also referred to as the second substrate W2L1. In an embodiment, the movement device 230 may comprise multiple robotic arms and/or multiple Bernoulli chucks to enable to simultaneously handle the first substrate W1L1 and the second substrate W2L1. In other words, the movement device 230 is not only configured to unload a substrate from the further substrate holder 702 but also configured to load a substrate on the further substrate holder 702 in this embodiment.

Figure 10C:
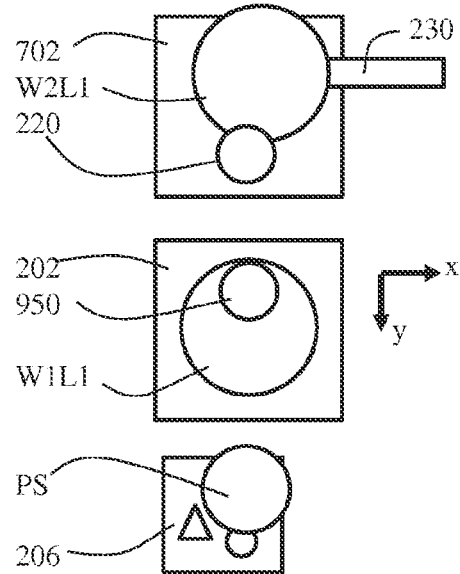

As depicted in FIG. 10C, the substrate holder 202 locates the first substrate W1L1 at (or beneath) the further measurement device 950. The further measurement device 950 provides further measurement information of the first substrate W1L1. The further measurement information is further wafer alignment information, which is information relating to the shape and the position of the first substrate W1L1. The further measurement device 950 provides coarse wafer alignment information, which is based on a small number of measurements, e.g. based on measuring the positions of a small number of the substrate alignment marks relative to one another or to compare the information with reference information. In this embodiment, a small number of the substrate alignment marks may, e.g., be between 3 and 16 substrate alignment marks. In general, less measurement time is necessary for measuring a smaller number of the substrate alignment marks; in other words, a shorter time in operating the further measurement device 950 is necessary to obtain the coarse wafer alignment information, comparing to the time necessary to obtain fine wafer alignment information by the measurement device 220. When the measurement device 950 is collecting the further measurement information, the sensor holder 206 is located beneath the projection system PS. The sensor holder 206 may, e.g., be supported and/or moved by the exchange mechanism 208 as depicted in FIG. 5. When the further measurement device 950 is collecting the further measurement information, the sensor on the sensor holder 206 is measuring the property of the projection system PS, the property of the aerial image, and/or the property of the exposure beam. When the further measurement device 950 is collecting the further measurement information, the measurement device 220 is collecting measurement information from the second substrate W2L1, which has been loaded on the further substrate holder 702 and is held by the further substrate holder 702.

Figure 10D:
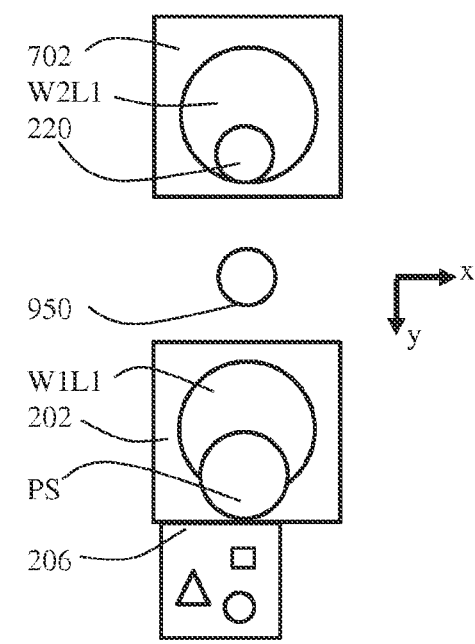

After the further measurement device 950 has collected the further measurement information, i.e., as soon as coarse wafer alignment information is obtained by the further measurement device 950, the mover 204 moves the substrate holder 202 with the first substrate W1L1 beneath the projection system PS; see FIG. 10D. The sensor holder 206 is moved away from beneath the projection system PS. The sensor holder 206 may be supported and/or moved by the exchange mechanism 208 as depicted in FIG. 9. When the first substrate W1L1 is beneath the projection system PS, the first substrate W1L1 is exposed with the exposure beam to project the pattern on the first substrate W1L1. Since a relatively short time is necessary in operating the further measurement device 950, which is located closer to the projection system than the measurement device 220, this configuration is beneficial in improving the throughput performance of the lithographic apparatus. If the further measurement device 950 is located far away from the projection system PS, and/or if another object interferes with the smooth movements of the substrate holder 202 and the sensor holder 206, the throughput performance of the lithographic apparatus will be deteriorated.

Figure 10E:
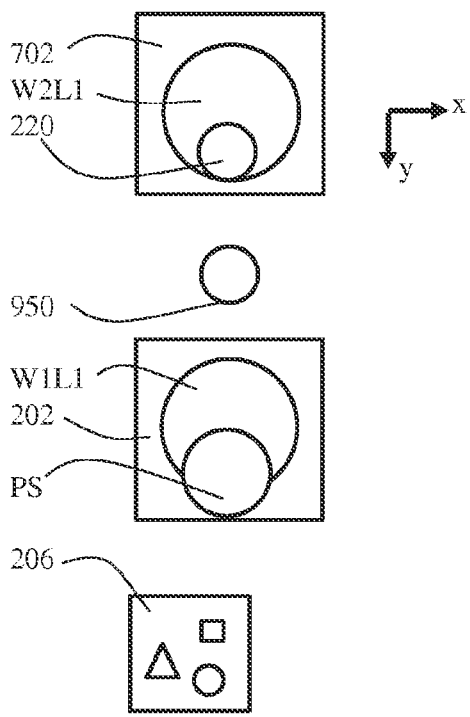

As depicted in FIG. 10E and in FIG. 9, during exposure of the first substrate W1L1 on the substrate holder 202 (i.e., during stepping and/or scanning motions of the substrate holder 202 beneath the projection system PS), the measurement device 220 continues measuring (collecting measurement information from) the second substrate W2L1 on the further substrate holder 702. During exposure of the first substrate W1L1 on the substrate holder 202, the sensor holder 206 is located (or parked) at a place inside the exposure apparatus 200, where the sensor holder 206 does not interfere with the stepping and/or scanning motions of the substrate holder 202 and the measurement of the second substrate W2L1 on the further substrate holder 702.

Figure 10F:
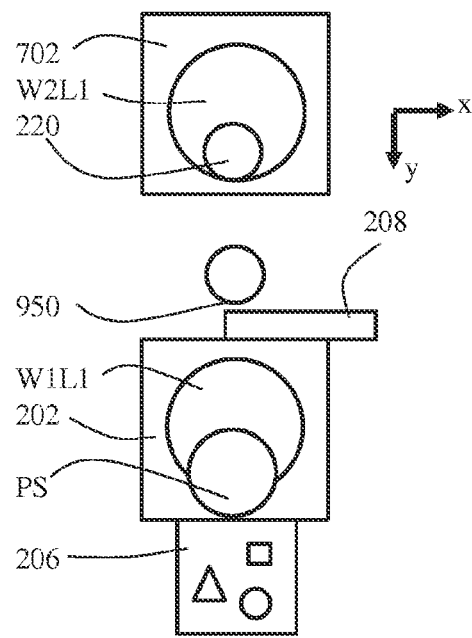
Figure 10G:
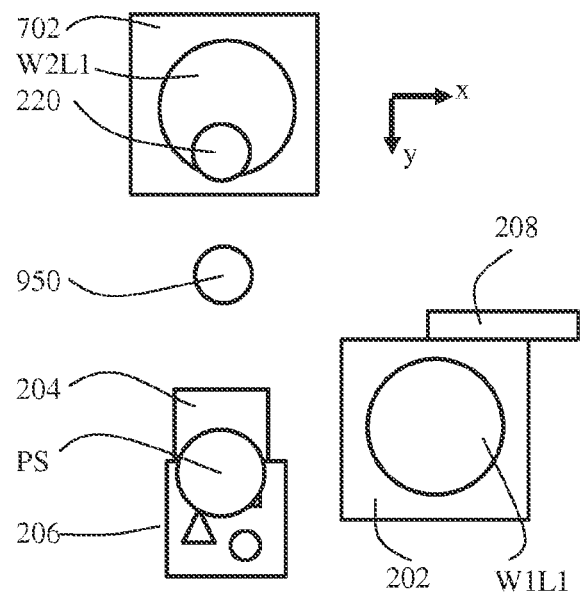
Figure 10H:
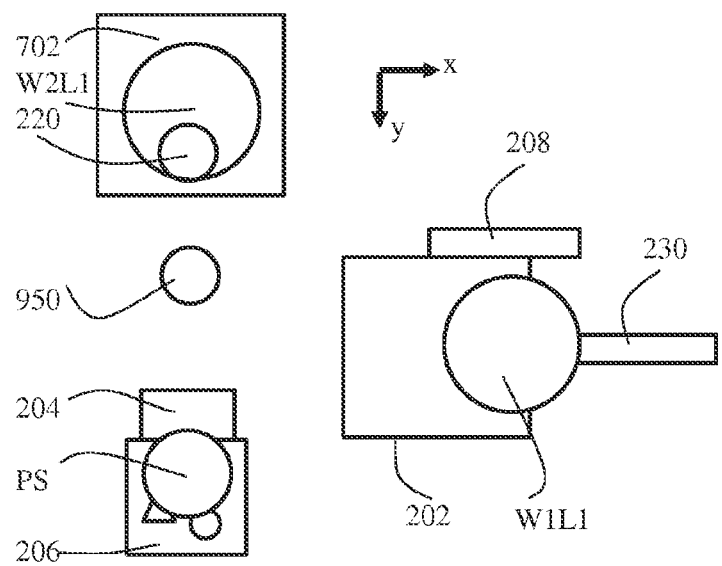

When all target portions Con the first substrate W1L1 have been exposed, the substrate holder 202 is decoupled from the mover 204, and the sensor holder 206 is coupled to the mover 204; in other words, the substrate holder 202 and the sensor holder 206 move in unison relatively to the mover 204 as depicted in FIG. 10F and FIG. 4. The exchange mechanism 208 moves the substrate holder 202 with the first substrate W1L1 to a substrate unload location as recognized in FIG. 10G. When the exchange mechanism 208 moves the substrate holder 202 away from beneath the projection system PS as depicted in FIG. 6, the mover 204 moves the sensor holder 206 beneath the projection system PS, which allows the sensor on the sensor holder 206 to start measuring the property of the projection system PS or the property of the exposure beam as depicted in FIG. 10H. Meanwhile, the measurement device 220 continues collecting measurement information from the second substrate W2L1 on the further substrate holder 702.

At the substrate unload location also as depicted in FIG. 10H, the first substrate W1L1 is unloaded from the substrate holder 202, for example, by the movement device 230; the movement device 230 may be operated similarly to how the movement device 230 has unloaded the first substrate W1L1 from the further substrate holder 702 as described in FIG. 10B. After the first substrate W1L1 is unloaded from the substrate holder 202, the first substrate W1L1 leaves (or is transported to the outside of) the lithographic apparatus; e.g., the first substrate W1L1 is contained in a FOUP.

Figure 10I:
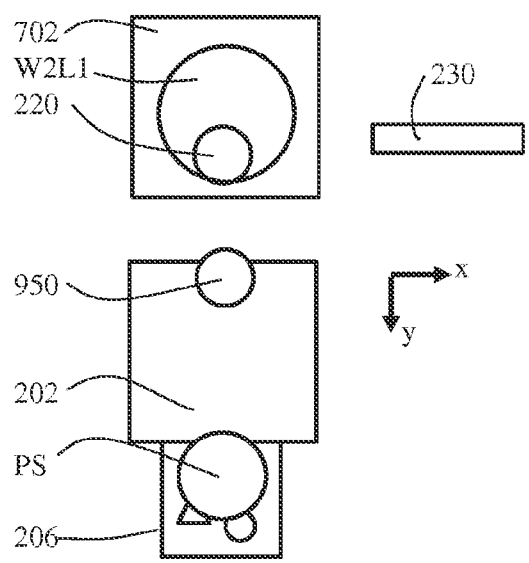

After the first substrate W1L1 is unloaded from the substrate holder 202, the substrate holder 202 is coupled to the mover 204 as depicted in FIG. 10I; in other words, the substrate holder 202 and the sensor holder 206 move in unison relatively to the mover 204 as depicted in FIG. 4. When the substrate holder 202 is coupled to the mover 204, the sensor holder 206 may be supported and/or moved by the exchange mechanism 208 as depicted in FIG. 5. Alternatively, the sensor holder 206 may remain supported by the mover 204 as depicted in FIG. 4. When the sensor holder 206 is located beneath the projection system PS, e.g., by the exchange mechanism 208, by the mover 204, and/or by the actuator equipped on the sensor holder 206 itself, the sensor on the sensor holder 206 may measure the property of the projection system PS, the property of the aerial image, and/or the property of the exposure beam. The movement device 230 transports the second substrate W2L1 from the further substrate holder 702 to the substrate holder 202 similarly to how the movement device 230 has transported the first substrate W1L1 from the further substrate holder 702 to the substrate holder 202 as described in FIG. 10B. The steps described above relating to the first substrate W1L1 are now repeated for the second substrate W2L1. When the steps described above are completed for all substrates in the first lot, the same or similar operations may be repeated for substrates in a second lot.

FIG. 10A depicts that the exposure apparatus is arranged to hold the first substrate W1L1 on the further substrate holder 702 while the measurement device 220 is acquiring the measurement information from the first substrate W1L1. At this moment, the sensor holder 206 may be located beneath the projection system PS, and the sensor on the sensor holder 206 may perform a measurement. FIG. 10C depicts that the exposure apparatus is arranged to hold the first substrate W1L1 on the substrate holder 202 while the further measurement device 950 is acquiring the further measurement information from the substrate W1L1. At this moment, the measurement device 220 can already start measuring (acquiring the measurement information from) the second substrate W2L1 on the further substrate holder 702. FIG. 9 and FIG. 10E depict that the measurement device 220 continues measuring the second substrate W2L1 on the further substrate holder 702 while the first substrate W1L1 on the substrate holder 202 is exposed. FIG. 10G depicts that the measurement device 220 continues measuring the second substrate W2L1 on the further substrate holder 702 while the substrate holder 202 is moving away from the projection system PS towards a substrate unload location. FIG. 10H depicts that the measurement device 220 continues measuring the second substrate W2L1 on the further substrate holder 702 while the first substrate W1L1 is unloaded from the substrate holder 202. At this moment, the sensor holder 206 may be located beneath the projection system PS, and the sensor on the sensor holder 206 may perform a measurement.

By configuring and operating the lithographic apparatus in such a way, the measurement device 220 has a maximum amount of time to collect the measurement information without limiting the throughput performance of the lithographic apparatus since it is not limited by the measurement time required by the measurement device 220. Therefore, better imaging quality can be achieved without deteriorating the overall productivity. In other words, better overall productivity can be achieved while simultaneously qualifying for a certain sufficient imaging quality. In contrast, if a longer measurement time is spent by the further measurement device 950 (e.g., if fine wafer alignment information is obtained by the further measurement device 950), the lithographic apparatus will suffer from a trade-off between the throughput performance and the imaging quality. Such a trade-off is also generally observed in a lithographic apparatus that comprises a single wafer stage and a single wafer alignment system. Additionally, the sensor on the sensor holder 206 can measure the property of the projection system PS, the property of the aerial image, and/or the property of the exposure beam without interfering with exposure of a substrate; hence, better imaging quality (and/or better uptime performance, e.g., in case the sensor holder 206 comprises a cleaning device) can be achieved without deteriorating the throughput performance. Additionally, the measurement device 220 and the further measurement device 950 do not increase a footprint of the lithographic apparatus, which is also called the exposure apparatus, since the measurement device 220 and the further measurement device 950 are smaller (especially in the horizontal directions, i.e., on the xy-plane) than the substrate holder 202, the further substrate holder 702, or the substrate W. Consequently, the configuration of the exposure apparatus 200 is a solution to the trilemma between the overall productivity, the imaging quality and the economy of an exposure apparatus.

The control unit may drive (or control a position of) the substrate holder 202 based on the measurement information and/or the further measurement information. For example, based on the measurement information and/or the further measurement information, the control unit may determine that a target portion C is not at a nominal position on the substrate W (i.e., the position of a target portion C on the substrate W when the substrate W is undeformed). Additionally or alternatively, based on the measurement information and/or the further measurement information, the control unit may derive the position on the (deformed) substrate W onto which an aerial image of the pattern should be projected. The control unit may drive the substrate holder 202 and correct the position of the substrate holder 202 such that the target portion C is at a correct position beneath the projection system PS during exposure. An example of such a control unit, which can be used in the context of an embodiment, is disclosed in Japanese patent application publication no. JP 2002-353121A, hereby incorporated in its entirety by reference.

Additionally or alternatively, based on the measurement information and/or the further measurement information, the control unit may control an optical property of an aerial image, an optical property of the projection system PS, or both of these. For example, the control unit may compensate for distortion of an image to be projected onto the substrate W, aberration of the projection system PS, and/or in-plane deformation of the substrate W by controlling one or both of these optical properties. These optical properties that the control unit controls may be magnification-X (i.e., magnification along the x-axis or in the stepping direction), magnification-Y (i.e., magnification along the y-axis or in the scanning direction), distortion, coma, field curvature, spherical aberration and/or astigmatism. One or some of these optical properties may be controlled by actuating the position and/or orientation of optical elements (in the projection system PS) during exposure, during scanning and/or during stepping. An example of such a control unit, which can be used in the context of an embodiment, is disclosed in Japanese patent application publication no. JP 2007-012673A, hereby incorporated in its entirety by reference.

The control unit may use the fine wafer alignment information as provided by the measurement device 220 to determine an accurate alignment correction (or a distortion map). The accurate alignment correction (or the distortion map) may have linear components (or low-order components) and higher-order components to define the actual shape of the substrate W compared to a nominal shape. These components of the distortion map may be mathematically expressed in terms of coefficients of a polynomial. For example, the fine wafer alignment information is based on an alignment mark at every target portion C or is based on a plurality of alignment marks at every target portion C (e.g., the substrate alignment marks P1, P2). A deformation or distortion of the substrate W within a target portion C (i.e., within an exposure field or within a die) may be referred to as an intra-field distortion. An overlay error at least partially induced by the intra-field distortion may be referred to as an intra-field overlay error. A deformation or distortion of the substrate W between dies or exposure fields may be referred to as an inter-field distortion. An overlay error at least partially induced by the inter-field distortion may be referred to as an inter-field overlay error. In an embodiment, the number of these alignment marks is less than the number of exposure fields (or the number of dies). Alternatively, the number of these alignment marks equals the number of exposure fields (or the number of dies). A deformation of the substrate W, such as bending or warping or stretching, results in a displacement of the alignment marks relative to each other. Based on the fine alignment information, the control unit may accurately determine the actual shape of the substrate W. The measurement device 220 may provide the fine wafer alignment information based on overlay marks, which may be located in a target portion C, and/or based on substrate alignment marks P1, P2, which may be located in between the target portions C. In an embodiment, the fine wafer alignment information, which contains information of a deformation of the substrate W, is based on the measurement of both overlay marks and substrate alignment marks. In an embodiment, the summation of numbers of overlay marks and/or substrate alignment marks on the substrate W, which are measured by the measurement device 220, is greater than or equal to the number of exposure fields (or the number of dies); e.g., if there are 96 exposure fields (or dies) on the substrate W, the summation of numbers of overlay marks and/or substrate alignment marks on the substrate W, which are measured by the measurement device 220, may be greater than or equal to 96. In general, wafer alignment information that is based on measurements of a larger number of marks (e.g., substrate alignment marks and/or overlay marks on the substrate W) enables to more accurately determine the actual shape of the substrate W. Hence, when the measurement device 220 measures a large number of marks on the substrate W, the imaging quality of the lithographic apparatus may increase (or may be improved).

When the movement device 230 transports the first substrate W1L1 from the further substrate holder 702 to the substrate holder 202, the actual shape of the substrate W may change into a new actual shape. However, the difference between the actual shape and the new actual shape typically has only low spatial frequencies. Based on a small number of measurements of substrate alignment marks, the further measurement device 950 may provide the coarse alignment information. The small number may be in a range of 3-20, for example 16. Based on the coarse alignment information and on the fine alignment information, the control unit may determine the new shape of the substrate W. Because the control unit is able to determine the new shape of the substrate W in this way, the imaging quality of the lithographic apparatus may increase (or may be improved), and/or better overall productivity can be achieved while simultaneously qualifying for a sufficient imaging quality required for manufacturing ICs.

The fine wafer alignment information as provided by the measurement device 220 may be implemented as a fine distortion map, i.e., a map of the surface of the substrate W indicating the amount of distortion with a large detail. The coarse wafer alignment information as provided by the further measurement device 950 may be implemented as a coarse distortion map, i.e., a map of the surface of the substrate W indicating the amount of distortion with less detail. The control unit may combine (or synthesize) the fine distortion map and the coarse distortion map to create a combined distortion map, which may also be referred to as a composite distortion map or an integrated distortion map. Based on the combined distortion map, the control unit may control the position of the substrate holder 202. Additionally or alternatively, the control unit may create a combined distortion map for each substrate in a lot (or for some substrates in a lot). For example, the control unit may create a first combined distortion map for the first substrate W1L1 by combining (or synthesizing) a first fine distortion map and a first coarse distortion map, which are maps of the surface of the first substrate W1L1. Similarly, the control unit may create a second combined distortion map for the second substrate W2L1 by combining (or synthesizing) a second fine distortion map and a second coarse distortion map, which are maps of the surface of the second substrate W2L1. Alternatively, the control unit may create a second combined distortion map for any one of the other substrates in the lot, based on the fine distortion map and the coarse distortion map of the substrate. Additionally or alternatively, the control unit may create a third combined distortion map for one of the other substrates in a second lot, based on the fine distortion map and the coarse distortion map of the substrate in the second lot.

Additionally or alternatively, based on a fine distortion map and/or a combined distortion map, the control unit may control an optical property of an aerial image, an optical property of the projection system PS, or both of these. Based on the fine distortion map, and/or based on the combined distortion map, and/or based on measurement data of one of the sensors that the sensor holder 206 holds, and/or based on a simulation model, the control unit may compensate for distortion of an image to be projected onto the substrate W, aberration of the projection system PS, and/or in-plane deformation of the substrate W. The measurement data, obtained by one of the sensors that the sensor holder 206 holds, may include a property of the projection system PS, a property of an aerial image, and/or a property of the exposure beam. The control unit may control one or some of the following optical properties of an aerial image and/or the projection system PS: magnification-X, magnification-Y, distortion, coma, field curvature, spherical aberration, astigmatism, or any other types of aberrations.

One or some of these optical properties of an aerial image and/or the projection system PS may be controlled by actuating the position and/or orientation of optical elements (with respect to the lens barrel, with respect to the path of the radiation beam B, or with respect to the optical axis of the projection system PS) during exposure, during scanning and/or during stepping. One or more of these optical elements in the projection system PS may be supported by a lens holder and/or may be actively actuated (or controlled) by piezo-actuators during exposure and/or during a scan.

One or some of these optical properties of an aerial image and/or the projection system PS may be actively controlled by a deformable mirror in the projection system PS. An example of such a deformable mirror, which can be used in the context of an embodiment, is disclosed in Japanese patent application publication no. JP 2013-161992A, hereby incorporated in its entirety by reference.

At least one of the optical properties of an aerial image may be controlled by bending the patterning device MA and/or by controlling the position of the substrate holder 202. In an embodiment, field curvature is at least partially compensated by bending the patterning device MA. Additionally or alternatively, inter-field overlay errors and/or low-order components of intra-field overlay errors are at least partially compensated by controlling the position of the substrate holder 202 during exposure. With these compensations, better imaging quality would be achieved; in other words, better overall productivity would be achieved while simultaneously qualifying for a sufficient imaging quality required for manufacturing ICs.

In an embodiment, the control unit creates a combined distortion map by combining (or synthesizing) a fine distortion map and a coarse distortion map, both of which contain information about in-plane deformation of the substrate W. Additionally or alternatively, based on the fine distortion map and/or the combined distortion map, the control unit compensates for in-plane deformation of the substrate W by controlling the position of the substrate holder 202, an optical property of an aerial image, and/or an optical property of the projection system PS. By operating the lithographic apparatus in such a way, a certain imaging quality requirement (e.g., an overlay requirement), e.g. for a specific node, can be satisfied. In contrast, when compensating for in-plane deformation of the substrate W, based on the coarse distortion map only, the same certain imaging quality requirement may not be satisfied.

In an embodiment, a fine distortion map and/or a combined distortion map may be used to calibrate, update and/or improve a simulation model that predicts an aerial image and/or a pattern created on the substrate. Additionally or alternatively, multiple fine distortion maps and/or multiple combined distortion maps may be used to calibrate, update and/or improve a simulation model. For example, a first fine distortion map (and/or a first combined distortion map), which provides information about in-plane deformation of the first substrate W1L1, and a second fine distortion map (and/or a second combined distortion map), which provides information about in-plane deformation of the second substrate W2L1, may be used as a set of measurement data obtained at different points of time during operation of an exposure apparatus for exposing a lot of wafers. This set of measurement data may be used to calibrate, update and/or improve a simulation model that predicts an aerial image and/or a pattern created on the substrate as a function of time. For example, such a simulation model may predict how an aerial image (and/or a pattern created on the substrate) is affected by temperature changes (over time) of the patterning device MA, optical elements in the projection system PS, and/or the substrate holder 202. Comparing the set of simulations and the set of measurement data obtained at different points of time, the accuracy of the simulation model may be improved. In addition to these multiple fine distortion maps (and/or multiple combined distortion maps), other types of measurement data (such as temperature of purging gas, the patterning device MA, optical elements in the projection system PS, and/or the substrate holder 202) may be used to calibrate, update and/or improve the simulation model. If a simulation model can be calibrated, updated and/or improved based on measurement data obtained during production of ICs (i.e., during an uptime of an exposure apparatus), better overall productivity can be achieved comparing to a method of calibrating, updating and/or improving the simulation model that is based on an offline test exposure using a test reticle (i.e., during a downtime of an exposure apparatus).

Aberrations may be described in terms of the Zernike polynomials. Aberrations may be described in terms of a set of trigonometric functions. Types of aberrations may be categorized into odd-order components and even-order components, e.g., based on the characteristics of the Zernike polynomials and/or the set of trigonometric functions. For example, Zernike terms described by a sine function may be referred to as odd-order components. Zernike terms described by a cosine function may be referred to as even-order components. Aberrations caused by a temperature change (e.g., heating or cooling) of optical elements in the projection system PS may be referred to as thermal aberrations.

In an embodiment, at least one of the even-order components of aberrations is controlled by a deformable mirror in the projection system PS. Additionally or alternatively, at least one of the odd-order components of aberrations is controlled by a deformable mirror in the projection system PS. Additionally or alternatively, thermal aberrations are at least partially compensated by a deformable mirror in the projection system PS. Additionally or alternatively, at least one of the odd-order components of aberrations is controlled by actuating the position and/or orientation of optical elements (with respect to the lens barrel, with respect to the path of the radiation beam B, or with respect to the optical axis of the projection system PS) during exposure, during scanning and/or during stepping. By operating the lithographic apparatus in such a way, better imaging quality can be achieved.

The movement device 230 may be arranged to transport the substrate W from the further substrate holder 702 to the substrate holder 202. The movement device 230 may comprise a robotic arm and/or a wafer handler. The movement device 230 may comprise a gripper to contact a bottom side of the substrate W. The movement device 230 may comprise a Bernouilli chuck to hold of the substrate W at the top surface of the substrate W. A gas film between the top surface of the substrate W and the Bernouilli chuck prevents physical contact between the substrate W and the Bernouilli chuck. A Bernoulli chuck is described in the PCT-application publication No. WO 2013/100203A2, hereby incorporated by reference. Part of the movement device 230 may be implemented as lifting pins to lift the substrate W from the substrate holder 202. The lifting pins may lift the substrate W from the substrate holder 202 far enough to provide a space between the substrate W and the substrate holder 202, such that the movement device 230 can provide a gripper beneath the substrate W to lift the substrate W from the lifting pins.

In an embodiment, the lithographic apparatus may comprise a liquid handling system configured to supply and confine the immersion liquid to a space defined between the projection system PS and at least one of the substrate holder 202, the substrate W, and the sensor holder 206. A lithographic apparatus that comprises a liquid handling system may be referred to as an immersion lithographic apparatus, an immersion exposure apparatus, or an immersion scanner. When the sensor holder 206 is located beneath the projection system PS as depicted in FIG. 10C, the liquid handling system may supply and confine the immersion liquid to the space defined between the projection system PS and the sensor holder 206. At a different point of time during operation of the immersion exposure apparatus, e.g., during exposure, when the substrate holder 202 is located beneath the projection system PS as depicted in FIG. 9 and FIG. 10D, the liquid handling system may supply and confine the immersion liquid to the space defined between the projection system PS and the substrate W (and/or to the space defined between the projection system PS and the substrate holder 202).

In an embodiment, the liquid handling system comprises a supply port, which is capable of supplying the immersion liquid to the space defined between the projection system PS and the substrate W (or defined between the projection system PS and the substrate holder 202, or defined between the projection system PS and the sensor holder 206). The liquid handling system further comprises a recovery port, which is capable of recovering the liquid from the space. A porous member, which has a plurality of holes (i.e., openings or pores), may be disposed in the recovery port. The porous member may, e.g., be a mesh plate wherein numerous small holes are formed in a mesh. An example of such a liquid handling system is disclosed in the PCT-application publication No. WO 2010/018825A1, which is hereby incorporated by reference in its entirety.

Additionally or alternatively, the liquid handling system comprises an actuatable flow plate, which is configured to be independently position-controlled with respect to the projection system PS and/or with respect to the substrate holder 202. In general, there can be a trade-off between a higher speed/acceleration (of the stepping and/or scanning motions of the substrate holder 202) and a stability of meniscus of the confined immersion liquid. In other words, the higher speed/acceleration of the stepping and/or scanning motions of the substrate holder 202 improves a throughput performance of the immersion exposure apparatus, but it also means that the relative velocity/acceleration between the liquid handling system and the substrate W (and/or the substrate holder 202) are higher. The higher relative velocity/acceleration can make the meniscus more unstable; furthermore, unstable meniscus can cause defect problems such as leakage of the immersion liquid and generation of droplets on the surface of the substrate holder 202, the substrate W, and/or the sensor holder 206. These defect problems can deteriorate the uptime performance of the immersion exposure apparatus. In case these defect problems are prevented by reducing the speed/acceleration of the stepping and/or scanning motions of the substrate holder 202 (i.e., by exposing the substrate W at a lower scan speed, scan acceleration, and stepping acceleration), the throughput performance of the immersion exposure apparatus will be deteriorated. Hence, this trade-off can also be recognized as a trade-off between a throughput performance and an uptime performance, which deteriorates an overall productivity of the immersion exposure apparatus. In order to prevent these potential defect problems, the control unit may drive (or control a position of) the substrate holder 202 and/or the actuatable flow plate to reduce the relative velocity and acceleration between the actuatable flow plate and the substrate W (and/or the substrate holder 202). By controlling the substrate holder 202 and/or the actuatable flow plate such a manner (i.e., by reducing the relative velocity/acceleration between the actuatable flow plate and the substrate W without reducing the scan speed, scan acceleration, and/or stepping acceleration), leakage of the immersion liquid during exposure (during the stepping and/or scanning motions of the substrate holder 202) may be prevented, and/or it may be ensured that the immersion liquid remains confined in the space defined between the projection system PS and the substrate W (and/or in the space defined between the projection system PS and the substrate holder 202). Therefore, better overall productivity can be achieved. An example of a liquid handling system, which can be used in the context of this embodiment, is disclosed in Japanese patent application publication No. JP 2014-120693A, which is hereby incorporated by reference in its entirety.

In an embodiment, the substrate holder 202 and the sensor holder 206 may be arranged to move in unison in order to transfer the immersion liquid from the substrate holder 202 (and/or the substrate W) to the sensor holder 206 (and vice versa). During the move in unison, the substrate holder 202 and the sensor holder 206 may be in contact with each other or separated from each other by a gap that is sufficiently small to prevent leakage of the immersion liquid.

In an embodiment, each of the substrate holder 202 and the sensor holder 206 has its own mover 204. The substrate holder 202 has a mover to move the substrate holder 202 relative to the projection system PS. The sensor holder 206 has a further mover to move the sensor holder 206 relative to the projection system PS. The mover and/or the further mover may comprise a planar motor to move on both the x-direction and the y-direction. The planar motor may be a moving magnet type planar motor, which has magnets and electrical coils. The magnets may be arranged on the substrate holder 202 and/or on the sensor holder 206, whereas the electrical coils are stationary. Additionally or alternatively, the further mover may comprise two stacked linear motors and may be arranged in an H-drive-arrangement. In an embodiment, the substrate holder 202 and the other substrate holder 212 are each moved by a planar motor, whereas the sensor holder 206 is moved by two stacked linear motors and may be arranged in an H-drive-arrangement. In an embodiment, the substrate holder 202, the other substrate holder 212 and the sensor holder 206 are each moved by linear motors arranged in an H-drive-arrangement.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

Although specific reference may have been made above to the use of embodiments of the invention in the context of optical lithography, it will be appreciated that an embodiment of the invention may be used in other applications, for example imprint lithography and e-beam lithography, and where the context allows, is not limited to optical lithography. In imprint lithography a topography in a patterning device MA defines the pattern created on a substrate. The topography of the patterning device may be pressed into a layer of resist supplied to the substrate whereupon the resist is cured by applying electromagnetic radiation, heat, pressure or a combination thereof. The patterning device MA is moved out of the resist leaving a pattern in it after the resist is cured.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. Other aspects of the invention are set out as in the following numbered clauses:

1. An exposure apparatus comprising;
    a substrate holder for holding a substrate;
    a sensor holder for holding a sensor; and
    a mover arranged for moving the substrate holder,
    wherein the mover is arranged to couple with the sensor holder in a first situation so as to move the sensor holder,
    wherein the mover is arranged to decouple from the sensor holder in a second situation so as to move without moving the sensor holder.
2. The exposure apparatus of clause 1, comprising an exchange mechanism for providing the sensor holder to the mover and for removing the sensor holder from the mover.
3. The exposure apparatus of clause 1 or clause 2, wherein the mover is arranged to move a further substrate holder for holding a further substrate, wherein a size of the further substrate is different from a size of the substrate.
4. The exposure apparatus of clause 3, wherein the sensor holder has a length and a width, wherein the length substantially equals a size of the substrate holder, wherein the width substantially equals a size of the further substrate holder, wherein the length and the width are different from each other.
5. The exposure apparatus of clause 3 or clause 4, wherein the mover is arranged to support the sensor holder in a first orientation and in a second orientation,
    wherein, in the first orientation, the sensor holder has a first angle along an axis perpendicular to a horizontal plane,
    wherein, in the second orientation, the sensor holder has a second angle along the axis perpendicular to the horizontal plane,
    wherein the first angle is different from the second angle.
6. The exposure apparatus of any of the preceding clauses, wherein the substrate holder and the sensor holder are arranged to move in unison relative to the mover in the first situation.
7. The exposure apparatus of clause 6, comprising a nozzle for providing a liquid to one of a top surface of the substrate holder and a top surface of the sensor holder, wherein the exposure apparatus is arranged to transfer the liquid from the one of the top surface of the substrate holder and the top surface of the sensor holder to the other of the top surface of the substrate holder and the top surface of the sensor holder while the substrate holder and the sensor holder move in unison relative to the mover.
8. The exposure apparatus of any of clauses 1-5, wherein the mover is arranged to decouple with the substrate holder in the first situation so as to move without moving the substrate holder.
9. The exposure apparatus of any of the preceding clauses, wherein the sensor holder is arranged to receive a radiation beam from the substrate holder.
10. The exposure apparatus of clause 9, wherein the substrate holder comprises a marker, wherein the radiation beam comprises information about an image projected on the marker.
11. The exposure apparatus of clause 9 or clause 10, wherein the sensor holder is arranged to propagate the radiation beam to a detector, wherein the sensor holder is movable relative to the detector.
12. The exposure apparatus of any of the preceding clauses, comprising an exposure device and a measurement device, wherein the exposure device is arranged to expose the substrate with an exposure beam, wherein the measurement device is arranged to provide measurement information of the substrate, wherein the exposure device and the measurement device are distant to each other, wherein the mover is arranged to support the substrate holder while near the exposure device.

13. The exposure apparatus of clause 12, comprising a stationary support arranged to support the substrate holder while near the measurement device.

14. The exposure apparatus of clause 13, comprising a first encoder head and a first scale, wherein the stationary support comprises a recess for holding the first encoder head, wherein the first scale is arranged at a bottom surface of the substrate holder, wherein the first encoder head faces the first scale while the substrate holder is near the measurement device and is arranged to provide a signal representative of positional information of the substrate holder.

15. The exposure apparatus of clause 14, wherein the first encoder head is coupled to the stationary support via a dynamical isolator.

16. The exposure apparatus of any of clauses 12-15, comprising a movement device arranged to move the substrate holder while supported by the stationary support.

17. The exposure apparatus of any of clauses 12-16, comprising a frame for supporting the exposure device, wherein the exposure device is movable relative to the frame.

18. The exposure apparatus of any of clauses 12-17, comprising a further measurement device arranged to provide further measurement information of the substrate, wherein the further measurement device is closer to the exposure device than the measurement device.

19. The exposure apparatus of any of the preceding clauses, comprising a second encoder, wherein the second encoder head is arranged to face the first scale so as to provide a second signal representative of positional information of the substrate holder.

20. The exposure apparatus of any of the preceding clauses, comprising a third encoder head and a third scale, wherein the third scale is arranged at a bottom side of the sensor holder, wherein the third encoder head is arranged to face the third scale, so as to provide a third signal representative of positional information of the sensor holder.

21. An exposure apparatus comprising;
a substrate holder for holding a substrate;
a sensor holder for holding a sensor;
a mover arranged for moving the substrate holder; and
a projection system arranged to provide a beam of radiation onto the substrate,
wherein during exposure, the projection system provides the beam of radiation onto the substrate when the sensor holder is decoupled from the mover,
wherein the mover couples with the sensor holder when the sensor measures a property of the projection system or the radiation beam.

22. The exposure apparatus of clause 21, comprising an exchange mechanism for providing the sensor holder to the mover and for removing the sensor holder from the mover.

23. The exposure apparatus of clause 21 or clause 22, wherein the mover is arranged to move a further substrate holder for holding a further substrate, wherein a size of the further substrate is different from a size of the substrate.

24. The exposure apparatus of clause 23, wherein the sensor holder has a length and a width, wherein the length substantially equals a size of the substrate holder, wherein the width substantially equals a size of the further substrate holder, wherein the length and the width are different from each other.

25. The exposure apparatus of clause 23 or clause 24, wherein the mover is arranged to support the sensor holder in a first orientation and in a second orientation,
wherein, in the first orientation, the sensor holder has a first angle along an axis perpendicular to a horizontal plane,
wherein, in the second orientation, the sensor holder has a second angle along the axis perpendicular to the horizontal plane,
wherein the first angle is different from the second angle.

26. The exposure apparatus of any of clauses 21-25, wherein the mover is arranged to decouple from the substrate holder so as to move without moving the substrate holder.

27. The exposure apparatus of any of clauses 21-26, wherein the sensor holder is arranged to receive the radiation beam from the substrate holder.

28. The exposure apparatus of clauses 27, wherein the substrate holder comprises a marker, wherein the radiation beam comprises information about an image projected on the marker.

29. The exposure apparatus of clause 27 or clause 28, wherein the sensor holder is arranged to propagate the radiation beam to a detector, wherein the sensor holder is movable relative to the detector.

30. The exposure apparatus of one clauses 21-29, comprising an exposure device and a measurement device, wherein the exposure device is arranged to expose the substrate with an exposure beam, wherein the measurement device is arranged to provide measurement information of the substrate, wherein the exposure device and the measurement device are distant to each other, wherein the mover is arranged to support the substrate holder while near the exposure device.

31. The exposure apparatus of clause 30, comprising a stationary support arranged to support the substrate holder while near the measurement device.

32. The exposure apparatus of clause 31, comprising a first encoder head and a first scale, wherein the stationary support comprises a recess for holding the first encoder head, wherein the first scale is arranged at a bottom surface of the substrate holder, wherein the first encoder head faces the first scale while the substrate holder is near the measurement device and is arranged to provide a signal representative of positional information of the substrate holder.

33. The exposure apparatus of clause 32, wherein the first encoder head is coupled to the stationary support via a dynamical isolator.

34. The exposure apparatus of any of clauses 31-33, comprising a movement device arranged to move the substrate holder while supported by the stationary support.

35. The exposure apparatus of any of clauses 31-34, comprising a frame for supporting the exposure device, wherein the exposure device is movable relative to the frame.

36. The exposure apparatus of any of clauses 31-35, comprising a further measurement device arranged to provide further measurement information of the substrate, wherein the further measurement device is closer to the exposure device than the measurement device.
37. The exposure apparatus of any of clauses 31-36, comprising a second encoder head, wherein the second encoder head is arranged to face the first scale so as to provide a second signal representative of positional information of the substrate holder.
38. The exposure apparatus of any of clauses 31-37, comprising a third encoder head and a third scale, wherein the third scale is arranged at a bottom side of the sensor holder, wherein the third encoder head is arranged to face the third scale, so as to provide a third signal representative of positional information of the sensor holder.
39. An exposure apparatus comprising:
   a first substrate holder for holding a first substrate;
   a second substrate holder for holding a second substrate;
   a projection system for exposing the first substrate with an exposure beam;
   a measurement device arranged to provide measurement information of the second substrate;
   a further measurement device arranged to provide measurement information of the first substrate,
   wherein the further measurement device is closer to the projection system than the measurement device.
40. The exposure apparatus of clause 39, wherein the further measurement information of the first substrate comprises a height profile and/or an in-plane deformation of the first substrate.
41. The exposure apparatus of clause 39 or clause 40, wherein the measurement device is configured to provide information about the positions of substrate alignment marks on the second substrate.
42. The exposure apparatus of any of clauses 39-41, comprising a sensor holder for holding a sensor, and a mover for moving the substrate holder relative to the projection system,
   wherein the sensor is arranged to measure a property of the exposure beam or the projection system.
43. The exposure apparatus of clause 42, wherein the further measurement device is arranged to acquire the measurement information of the first substrate while the sensor is measuring the property of the exposure beam.
44. The exposure apparatus of any of clauses 39-43, the lithographic apparatus is arranged to transport the first substrate from the first substrate holder to the second substrate holder, wherein the measurement device arranged to provide measurement information of the first substrate.
45. The exposure apparatus of any of clauses 39-44, wherein the measurement device is arranged to acquire the measurement information of the second substrate when the second substrate holder is at the first position, wherein the further measurement device is arranged to acquire the measurement information of the second substrate when the second substrate holder is at the second position.
46. The exposure apparatus of any of clauses 39-45, wherein the further measurement device is arranged propagate a plurality of measurement beams on the first substrate simultaneously.
47. The exposure apparatus of any of clauses 39-46, comprising a control unit arranged to drive the first substrate holder and the second substrate holder based on the measurement information of the first substrate and measurement information of the second substrate.
48. The exposure apparatus of any of clauses 39-47, wherein the first substrate is provided with a first alignment mark, wherein the further measurement device is arranged to provide the measurement information of the first substrate based on a position of the second alignment mark.
49. The exposure apparatus of any of clauses 39-48, wherein the second substrate is provided with a second alignment mark, wherein the measurement device is arranged to provide the measurement information of the second substrate based on a position of the second alignment mark.

Other aspects of the invention are described in the following numbered clauses:

50. An exposure apparatus comprising:
   a first substrate holder configured to hold a substrate;
   a second substrate holder configured to hold the substrate;
   a sensor holder configured to hold a sensor, a projection system configured to expose the substrate with an exposure beam;
   a measurement device configured to provide measurement information of the substrate;
   a further measurement device configured to provide further measurement information of the substrate,
   wherein the sensor is configured to measure a property of the exposure beam and/or the projection system,
   wherein the projection system is configured to expose the sensor with the exposure beam.
51. The exposure apparatus of clause 50, wherein the exposure apparatus is arranged to hold the substrate on the first substrate holder while the measurement device is acquiring the measurement information of the substrate, and wherein the exposure apparatus is arranged to hold the substrate on the second substrate holder while the further measurement device is acquiring the further measurement information of the substrate.
52. The exposure apparatus according to clause 50 or clause 51, wherein at least one of the measurement device and the further measurement device is configured to provide information about a deformation of the substrate.
53. The exposure apparatus according to any of clauses 50 to 52, wherein the measurement device is located further away from the projection system than the further measurement device.
54. The exposure apparatus according to any of clauses 50 to 53, wherein the further measurement device comprises a levelling sensor system configured to provide a beam of radiation at a slanted angle with the substrate and configured to provide information about a flatness of the substrate.
55. The exposure apparatus according to any of clauses 50 to 54, wherein at least one of the measurement device and the further measurement device comprises an alignment sensor configured to measure positions of substrate alignment marks on the substrate.
56. The exposure apparatus according to clause 55, wherein the measurement device is configured to provide fine alignment information based on measurement of the substrate alignment marks, wherein the further measurement device is configured to provide coarse alignment information based on measurements of the substrate alignment marks, wherein the exposure apparatus comprises a control unit configured to create a fine distortion map based on the fine alignment information, to create a coarse distortion map based on the coarse alignment information, and to create a combined distortion map by combining the fine distortion map and the coarse distortion map.

57. The exposure apparatus according to clause 56, comprising a simulation model configured to predict a pattern created on the substrate by the exposure beam, wherein the control unit is configured to calibrate or update the simulation model, based on the fine distortion map and/or the combined distortion map.

58. The exposure apparatus according to clause 56 or clause 57, wherein the control unit is configured to control an optical property of the projection system, based on the fine distortion map and/or the combined distortion map.

59. The exposure apparatus according to any of clauses 50 to 58, wherein the exposure apparatus comprises:
   a support structure configured to hold a patterning device, wherein the patterning device is configured to impart a pattern into the exposure beam so as to image the pattern onto the substrate,
   wherein the support structure is configured to actively bend the patterning device.

60. The exposure apparatus according to any of clauses 50 to 59, wherein the projection system comprises:
   a lens barrel;
   an optical element; and
   a lens holder configured to hold the optical element, wherein the lens holder comprises an actuator to control the position and/or orientation of the optical element with respect to the lens barrel.

61. The exposure apparatus according to any of clauses 50 to 60, comprising a liquid handling system configured to supply and confine immersion liquid to a space defined between the projection system and at least one of the first substrate holder, the second substrate holder, the substrate, and the sensor holder.

62. The exposure apparatus according to clause 61, wherein the liquid handling system comprises a recovery port configured to recover the immersion liquid from the space, wherein a porous member is disposed in the recovery port.

63. The exposure apparatus according to any of clauses 50 to 62, wherein the projection system comprises a deformable mirror.

64. The exposure apparatus according to any of clauses 50 to 63, wherein the property of the exposure beam is at least one of a dose, an aberration, and a uniformity.

What is claimed is:

1. An apparatus for an exposure tool configured to project a radiation beam onto a target portion of a substrate, the apparatus comprising:
   a first substrate holder configured to hold a first substrate;
   a second substrate holder configured to hold a second substrate;
   a sensor holder configured to hold a sensor and/or a detector;
   a measurement device configured to provide information about in-plane deformation and/or information about a height profile; and
   a further measurement device configured to provide information about positions of alignment marks,
   wherein the measurement device is configured to measure the first substrate on the first substrate holder while the further measurement device measures the second substrate on the second substrate holder and while the sensor holder is located at least partly underneath a projection system of the exposure tool, and
   wherein the measurement device and the further measurement device are spaced apart such that, during measurement by the measurement device of the first substrate while on the first substrate holder, the measurement device is configured to measure the first substrate on the first substrate holder but not the second substrate while on the second substrate holder, and
   wherein the further measurement device is located between the measurement device and a location underneath the projection system of the exposure tool.

2. The apparatus of claim 1, wherein the measurement device is configured to provide information about a height profile and wherein the information about the height profile provided by the measurement device is information about a flatness.

3. The apparatus of claim 1, wherein the measurement device is configured to measure positions of substrate alignment marks and/or overlay marks on the substrate.

4. The apparatus of claim 1, wherein the measurement device comprises an alignment system that comprises an alignment sensor.

5. The apparatus of claim 1, wherein the sensor and/or detector is configured:
   to measure a property of the radiation beam,
   to measure a polarization of an illumination system,
   to measure a property of a projection system,
   to measure an aerial image of a pattern projected by a projection system, and/or
   to detect a position of a marker on a patterning device.

6. The apparatus of claim 1, comprising an aerial image measuring device configured to measure an aerial image of a pattern projected by a projection system,
   wherein the second substrate holder comprises a marker, and
   wherein the aerial image measuring device comprises the marker on the second substrate holder and the sensor and/or detector on the sensor holder.

7. The apparatus of claim 1, wherein the sensor holder holds a wavefront aberration measuring device, an illuminance monitor, an illuminance irregularity sensor, and/or a uniformity sensor.

8. The apparatus of claim 1, further comprising a liquid handling system configured to supply and confine immersion liquid to a space defined between a projection system and at least one selected from: the first substrate holder, the second substrate holder, the substrate, and/or the sensor holder.

9. The apparatus of claim 1, further comprising a movement device configured to lift the substrate up and off an upper surface of the first substrate holder and transfer the substrate to the second substrate holder.

10. The apparatus of claim 1, wherein the further measurement device is located between the measurement device and the sensor holder.

11. An apparatus for an exposure tool configured to project a radiation beam onto a target portion of a substrate, the apparatus comprising:
   a first substrate holder configured to hold the substrate, the first substrate holder comprising an upper surface to directly contact the substrate;
   a second substrate holder configured to hold the substrate;

a movable sensor holder configured to hold a sensor and/or a detector, wherein the first and second tables are movable with the respect to the movable sensor holder; and a movement device configured to lift the substrate up and out of direct contact with the upper surface of the first substrate holder and transfer the substrate to the second substrate holder without an intermediate placement of the substrate on another surface between movement of the substrate from the first substrate holder to the second substrate holder.

12. The apparatus of claim 11, further comprising a measurement device configured to provide information about in-plane deformation of the substrate and/or information about a height profile of the substrate.

13. The apparatus of claim 11, further comprising a measurement device configured to provide information about positions of substrate alignment marks on the substrate.

14. The apparatus of claim 11, wherein the sensor and/or detector is configured:
to measure a property of the radiation beam,
to measure a polarization of an illumination system,
to measure a property of a projection system,
to measure an aerial image of the pattern projected by a projection system, and/or
to detect a position of a marker on a patterning device.

15. The apparatus of claim 11, further comprising a liquid handling system configured to supply and confine immersion liquid to a space defined between a projection system and at least one selected from: the first substrate holder, the second substrate holder, the substrate, and/or the sensor holder.

16. An apparatus for an exposure tool configured to project a radiation beam onto a target portion of a substrate, the apparatus comprising:
a movable first substrate holder configured to hold the substrate, the first substrate holder comprising an upper surface to directly contact the substrate;
a movable second substrate holder configured to hold the substrate;
a sensor holder configured to hold a sensor and/or a detector configured to receive the radiation beam; and
a movement device configured to lift the substrate up and out of direct contact with the upper surface of the first substrate holder and transfer the substrate to the second substrate holder without an intermediate placement of the substrate on another surface between movement of the substrate from the first substrate holder to the second substrate holder.

17. The apparatus of claim 16, further comprising a measurement device configured to provide information about in-plane deformation of the substrate and/or information about a height profile of the substrate.

18. The apparatus of claim 17, further comprising a further measurement device configured to provide information about positions of alignment marks on the substrate.

19. The apparatus of claim 17, wherein the measurement device is configured to measure positions of substrate alignment marks and/or overlay marks on the substrate.

20. The apparatus of claim 16, wherein the sensor and/or detector is a wavefront aberration measuring device, an illuminance monitor, an illuminance irregularity sensor, and/or a uniformity sensor.

* * * * *